(12) United States Patent
Kim et al.

(10) Patent No.: US 8,168,492 B2
(45) Date of Patent: May 1, 2012

(54) FIELD EFFECT TRANSISTORS WITH VERTICALLY ORIENTED GATE ELECTRODES AND METHODS FOR FABRICATING THE SAME

(75) Inventors: Sung-Min Kim, Incheon (KR); Dong-Gun Park, Sungnam (KR); Dong-Won Kim, Sungnam (KR); Min-Sang Kim, Seoul (KR); Eun-jung Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/754,128

(22) Filed: Apr. 5, 2010

(65) Prior Publication Data

US 2010/0221876 A1    Sep. 2, 2010

Related U.S. Application Data

(60) Division of application No. 11/396,488, filed on Apr. 3, 2006, now abandoned, which is a continuation-in-part of application No. 10/945,246, filed on Sep. 20, 2004, now Pat. No. 7,129,541.

(30) Foreign Application Priority Data

Sep. 19, 2003  (KR) .......................... 10-2003-0065128
Apr. 9, 2005   (KR) .......................... 10-2005-0029721

(51) Int. Cl.
 *H01L 21/8238* (2006.01)
(52) U.S. Cl. ................. 438/206; 257/E21.442; 438/212
(58) Field of Classification Search .................. 438/206, 438/212; 257/240, 241, 244, E21.422
 See application file for complete search history.

(56) References Cited

U.S. PATENT DOCUMENTS

| | | | | |
|---|---|---|---|---|
| 5,096,845 A * | 3/1992 | Inoue | ............................ | 438/213 |
| 5,576,227 A | 11/1996 | Hsu | | |
| 5,614,749 A | 3/1997 | Ueno | | |
| 5,744,393 A | 4/1998 | Risch et al. | | |
| 5,756,385 A | 5/1998 | Yuan et al. | | |
| 5,930,648 A * | 7/1999 | Yang | ............................ | 438/443 |
| 6,063,669 A * | 5/2000 | Takaishi | ........................ | 438/270 |
| 6,093,606 A | 7/2000 | Lin et al. | | |
| 6,194,748 B1 * | 2/2001 | Yu | ................................ | 257/216 |
| 6,335,247 B1 | 1/2002 | Tews et al. | | |

(Continued)

FOREIGN PATENT DOCUMENTS

| | | |
|---|---|---|
| CN | 1168740 | 12/1997 |
| CN | 1503371 | 6/2004 |
| JP | 03012969 | 1/1991 |
| KR | 1020050028628 | 3/2005 |

OTHER PUBLICATIONS

Kedzierski, Jakub, et al., "Complementary silicide source/drain thin-body MOSFETs for the 20nm gate length regime," Department of Electrical Engineering and Computer Sciences, University of California at Berkeley, Berkeley, CA, 94720 USA, 2000, pp. 57-60.

(Continued)

*Primary Examiner* — Bradley K Smith
*Assistant Examiner* — Amar Movva
(74) *Attorney, Agent, or Firm* — Onello & Mello, LLP

(57) ABSTRACT

In semiconductor devices, and methods of formation thereof, both planar-type memory devices and vertically oriented thin body devices are formed on a common semiconductor layer. In a memory device, for example, it is desirable to have planar-type transistors in a peripheral region of the device, and vertically oriented thin body transistor devices in a cell region of the device. In this manner, the advantageous characteristics of each type of device can be applied to appropriate functions of the memory device.

48 Claims, 43 Drawing Sheets

U.S. PATENT DOCUMENTS

| | | | |
|---|---|---|---|
| 6,867,455 | B2 | 3/2005 | Itoh et al. |
| 7,087,956 | B2 | 8/2006 | Umebayashi |
| 7,129,541 | B2 | 10/2006 | Kim et al. |
| 2002/0056884 | A1 | 5/2002 | Baliga |
| 2002/0137271 | A1 | 9/2002 | Forbes et al. |
| 2003/0127425 | A1 | 7/2003 | Nishiki et al. |
| 2004/0026745 | A1 | 2/2004 | Itoh et al. |
| 2004/0150071 | A1 | 8/2004 | Kondo et al. |
| 2004/0222473 | A1 | 11/2004 | Risaki |
| 2005/0032322 | A1 | 2/2005 | Kim et al. |
| 2005/0062109 | A1 | 3/2005 | Kim et al. |
| 2006/0192249 | A1 | 8/2006 | Kim et al. |

OTHER PUBLICATIONS

Yeo, Yee-Chia, et al., "Design and Fabrication of 50-nm Thin-Body p-MOSFETs With a SiGe Heterostructure Channel," IEEE Translations on Electron Devices, vol. 49, No. 2, Feb. 2002.

Kim, Sung Min, et al., "A Novel Multi-channel Field Effect Transistor (McFET) on Bulk Si for High Performance Sub-80nm Application," Electron Devices Meeting, 2004, IEDM Technical Digest, Dec. 13-15, 2004, pp. 639-642.

"VLSI Manufacturing Technique," Feb. 20, 1997, ISBN No. 957-584-327-4 (p. 141).

"VLSI Manufacturing Technique," CMOS, published on Feb. 20, 1997, with ISBN No. 957-584-327-4 p. 5.

Office Action issued on Jan. 13, 2009, in corresponding Taiwanese Application No. 095112561.

"Field Effect Transistors With Vertically Oriented Gate Electrodes and Methods for Fabricating the Same" Specification, Drawings, and Prosecution History of U.S. Appl. No. 11/396,488, filed Apr. 3, 2006 by Sung-Min Kim, et al., which is stored in the United States Patent and Trademark Office (USPTO) Image File Wrapper (IFW) system.

\* cited by examiner

FIG. 11A
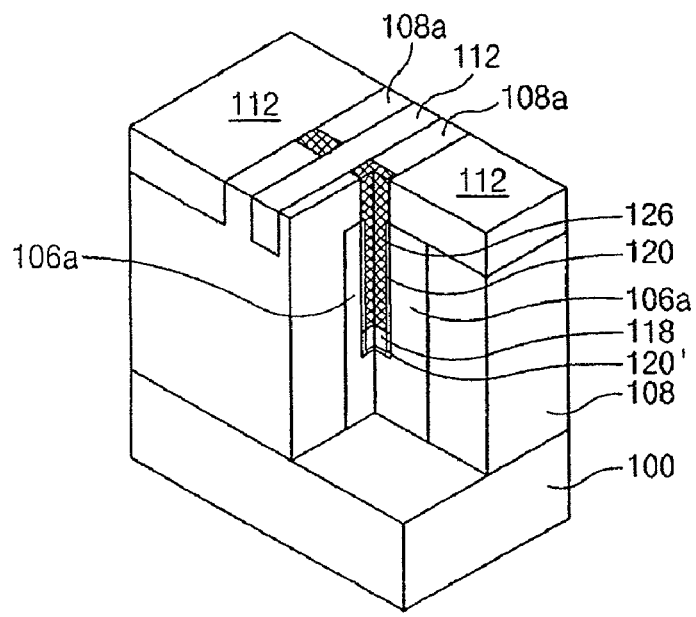
FIG. 11B
FIG. 11C
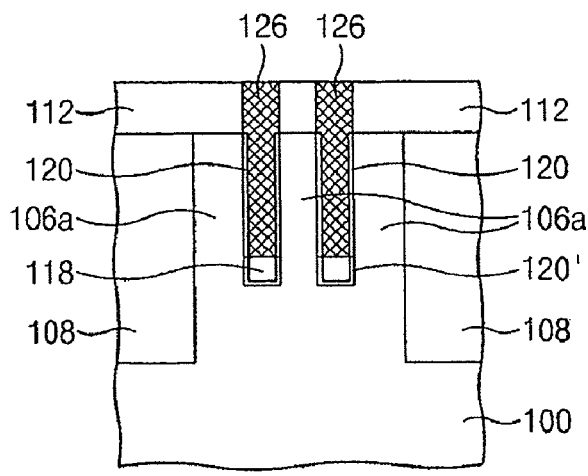
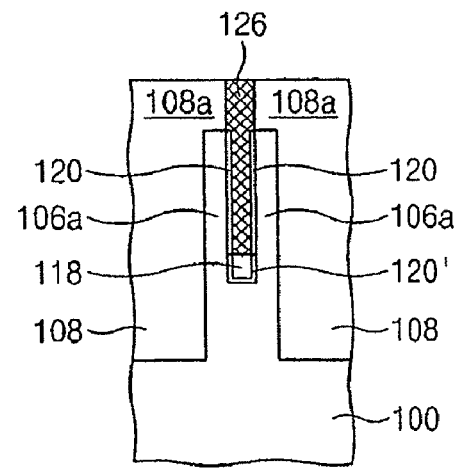

FIG. 12A
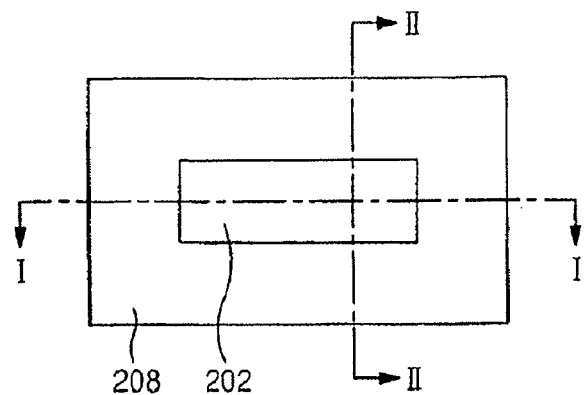
FIG. 12B
FIG. 12C
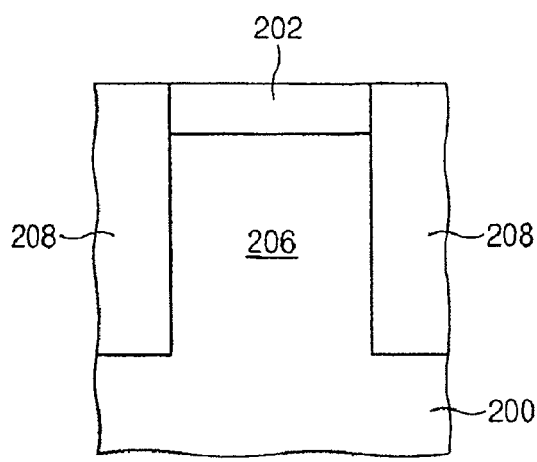
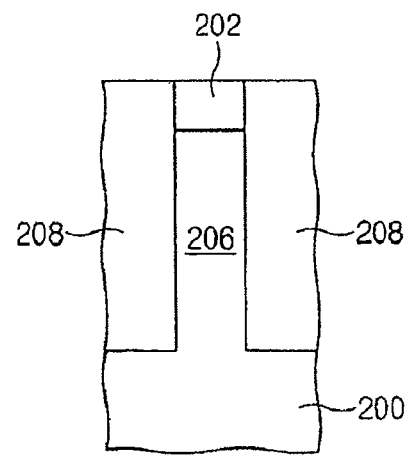

FIG. 15A
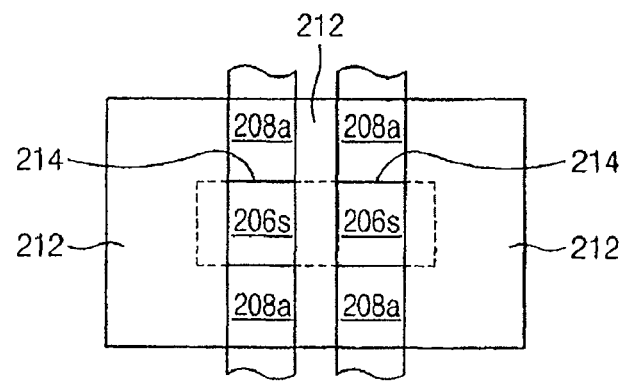
FIG. 15B
FIG. 15C
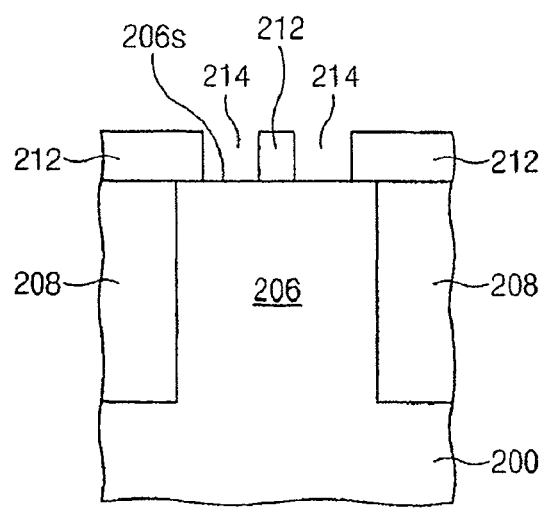
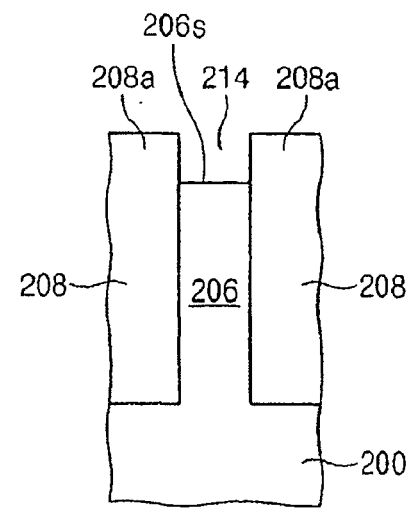

CELL REGION    PERIPHERAL REGION

CELL REGION    PERIPHERAL REGION

CELL REGION

FIELD EFFECT TRANSISTORS WITH VERTICALLY ORIENTED GATE ELECTRODES AND METHODS FOR FABRICATING THE SAME

RELATED APPLICATIONS

This application is a divisional of U.S. patent application Ser. No. 11/396,488, filed on Apr. 3, 2006, which relies for priority on Korean patent application number 10-2005-0029721, filed on Apr. 9, 2005, U.S. patent application Ser. No. 11/396,488, filed on Apr. 3, 2006, is a continuation-in-part application of U.S. patent application Ser. No. 10/945,246, filed on Sep. 20, 2004, which relies for priority on Korean patent application number 10-2003-0065128, filed on Sep. 19, 2003, the contents of which applications are incorporated herein in their entirety by reference.

BACKGROUND OF THE INVENTION

The present invention relates to semiconductor devices, and more specifically, to thin body transistors and methods for fabricating the same.

In recent years, semiconductor devices have become highly integrated to achieve a combination of high-performance, high-speed, and economic efficiency. However, as semiconductor devices become more highly integrated, a variety of operational and structural problems may arise. For example, as the channel length of a typical planar field effect transistor becomes shorter, short channel effects, such as punch-through, may occur, parasitic capacitance, for example junction capacitance, between junction regions and the substrate may be increased, and leakage current may be increased.

To address some of the above problems, thin-body field effect transistors using silicon-on-insulator (SOI) technology have been proposed. However, such devices may be susceptible to floating body effects, which may be caused by heat generated during device operation and/or an accumulation of high-energy hot carriers. In addition, a back bias voltage cannot be applied to compensate for changes in threshold voltage because of the insulator layer, so device performance may be affected. Also, problems associated with stress due to differences in thermal expansion coefficients between the substrate and the insulating layer may occur. Furthermore, since SOI field effect transistor technology may require connecting two substrates, processing costs may be increased and fabrication may become relatively complicated.

SUMMARY OF THE INVENTION

According to some embodiments of the present invention, a field-effect transistor on an active region of a semiconductor substrate may include a vertically protruding thin-body portion of the semiconductor substrate and a vertically oriented gate electrode at least partially inside a cavity defined by opposing sidewalls of the vertically protruding portion of the substrate. In further embodiments, the transistor may include an insulating layer surrounding an upper portion of the vertically oriented gate electrode, and a laterally oriented gate electrode on the insulating layer and connected to a top portion of the vertically oriented gate electrode. The vertically oriented gate electrode may be formed of silicide, and the laterally oriented gate electrode may be formed of one of polysilicon, metal, and metal silicide. In addition, the laterally oriented gate electrode may have a width that is greater than a width of the vertically oriented gate electrode. The transistor may also include spacers surrounding the upper portion of the vertically oriented gate electrode between the vertically oriented gate electrode and the insulating layer.

In other embodiments, the transistor may include a lower insulating layer inside the cavity between a bottom portion of the vertically oriented gate electrode and the substrate. Also, the vertically oriented gate electrode may have a lower portion inside the cavity and an upper portion outside the cavity, wherein the upper portion has a width greater than a width of the lower portion.

In some embodiments according to the present invention, a field effect transistor in a non-volatile EPROM may include a T-shaped gate electrode having a lateral portion on a top surface of a semiconductor substrate and having a vertical portion at least partially inside a cavity defined by opposing sidewalls of a vertically protruding portion of the substrate. In other embodiments, the T-shaped gate electrode may be a first T-shaped gate electrode and the cavity may be a first cavity. The transistor may further include a second T-shaped gate electrode having a lateral portion on a top surface of the substrate and having a vertical portion at least partially inside a second cavity defined by opposing sidewalls of the vertically protruding portion of the substrate. The lateral portion of the second T-shaped gate electrode may be substantially parallel to the lateral portion of the first T-shaped gate electrode, and the vertical portion of the second T-shaped gate electrode may be substantially parallel to the vertical portion of the first T-shaped gate electrode.

In additional embodiments, a field effect transistor in a non-volatile EPROM may include a vertically extending gate electrode at least partially surrounded by a thin-body portion of a semiconductor substrate where a channel is to be formed.

In yet other embodiments, a field effect transistor in a non-volatile EPROM may include a U-shaped thin-body portion of a semiconductor substrate where a channel is to be formed and a vertically extending gate electrode on opposing inner sidewalls of the U-shaped portion of the substrate.

According to further embodiments of the present invention, a method of forming a field effect transistor on an active region of a semiconductor substrate may include forming a cavity in a vertically protruding thin-body portion of the substrate, and filling the cavity to form a vertically oriented gate electrode having at least a lower portion inside the cavity. The cavity may be defined by opposing sidewalls of the vertically protruding portion of the substrate.

In some embodiments, the method may include forming an insulating layer surrounding an upper portion of the vertically oriented gate electrode, and forming a laterally oriented gate electrode on the insulating layer. The laterally oriented gate electrode may be connected to a top portion of the vertically oriented gate electrode. In other embodiments, the vertically oriented gate electrode and the laterally oriented gate electrode may be formed simultaneously.

In further embodiments, filling the cavity may include filling the cavity in the vertically protruding portion of the substrate with polysilicon, forming a heat-resistant metal layer on the surface of the substrate, and applying a thermal treatment process to the substrate to form a vertically oriented gate electrode having at least a lower portion inside the cavity. Filling the cavity may further include controlling a thickness of the heat resistant metal layer and the duration of the thermal treatment process to form the vertically oriented gate electrode in the cavity.

In some embodiments, the method may include forming spacers on the substrate before forming the cavity in the channel region to control a width of the channel region. The method may further include forming a lower insulating layer in the cavity between a bottom of the vertically oriented gate electrode and the substrate. In addition, the method may include performing an ion implantation process after forming the insulating layer.

In other embodiments, a method of forming a field effect transistor in a non-volatile EPROM may include forming a T-shaped gate electrode having a lateral portion on a top surface of a semiconductor substrate and having a vertical portion at least partially inside a cavity defined by opposing sidewalls of the substrate.

In certain applications of the vertically oriented thin body transistor, it is beneficial to have both planar-type memory devices and vertically oriented thin body devices formed on the same semiconductor layers. In a memory device, for example, it is desirable to have planar-type transistors in a peripheral region of the device, and vertically oriented thin body transistor devices in a cell region of the device. In this manner, the advantageous characteristics of each type of device can be applied to appropriate functions of the memory device.

In another aspect, the present invention is directed to semiconductor device. The semiconductor device comprises: a semiconductor layer and a first transistor in a first region of the semiconductor layer. The first transistor comprises: a gate electrode that extends into the semiconductor layer in a vertical direction; a source region and a drain region in the semiconductor layer arranged at opposite sides of the gate electrode in a horizontal direction; and a lateral channel region of the semiconductor layer at a side of the gate electrode in a lateral direction that extends in the horizontal direction between the source region and the drain region. A second transistor is also formed in a second region of the semiconductor layer, the second transistor comprising a planar transistor.

In one embodiment, the second planar transistor comprises: a gate electrode on the gate insulating layer; and a source region and a drain region in the semiconductor layer arranged on opposite sides of the gate electrode in a horizontal direction; and a second channel region in the semiconductor layer that lies below the gate electrode and not at a lateral side portion of the gate electrode in a lateral direction that extends in the horizontal direction between the source region and the drain region.

In another embodiment, the first region is a memory cell region of the semiconductor device and wherein the second region is a peripheral region of the semiconductor device.

In another embodiment, the semiconductor device further comprises an isolation region between the first transistor and the second transistor. In another embodiment, the isolation region comprises a shallow trench isolation (STI) structure in the semiconductor layer.

In another embodiment, the first transistor further includes a lower channel region that extends under the gate electrode between the source region and the drain region of the first transistor.

In another embodiment, the semiconductor layer comprises a semiconductor substrate. In another embodiment, the semiconductor layer is one selected from the group consisting of SOI (silicon-on-insulator), SiGe (silicon germanium), and SGOI (silicon germanium on insulator) layers.

In another embodiment, the lateral channel region is of a height in the vertical direction ranging between about 500 and 2000 Angstroms, for example, of a height in the vertical direction ranging between about 1000 and 1500 Angstroms.

In another embodiment, the lateral channel region is of a thickness in the lateral direction less than about 200 Angstroms, for example, of a thickness in the lateral direction ranging between about 10 and 150 Angstroms.

In another embodiment, the lateral channel region is of a thickness that is selected as a function of a desired threshold voltage of the first transistor.

In another embodiment, the lateral channel region of the first transistor comprises a first lateral channel region and a second lateral channel region at opposite sides of the gate electrode, each extending in a horizontal direction between the source region and the drain region.

In another embodiment, the semiconductor device further comprises a first gate dielectric between the gate electrode of the first transistor and the source and drain regions and between the gate electrode of the first transistor and the lateral channel region. In another embodiment, the semiconductor device further comprises a second dielectric between a gate electrode and a channel region of the second transistor and wherein the second dielectric is of a different thickness than the first dielectric. In another embodiment, the semiconductor device further comprises a second dielectric between a gate electrode and a channel region of the second transistor and wherein the second dielectric is of a different material than the first dielectric.

In another embodiment, the gate electrode comprises a first portion that extends into the semiconductor layer in the vertical direction and a second portion that extends on the semiconductor layer in the horizontal or lateral directions. In another embodiment, the first portion is formed of a material that is different than the second portion. In another embodiment, the gate electrode has a T-shaped cross-section. In another embodiment, the material of the first portion has a direct effect on a threshold voltage of the first transistor. In another embodiment, the material of the first portion and the material of the second portion comprise metal and polysilicon respectively.

In another embodiment, a threshold voltage of the first transistor and a threshold voltage of the second transistor are different.

In another embodiment, the semiconductor device is a DRAM memory device and the threshold voltage of the first transistor is about 0.7 volts and the threshold voltage of the second transistor is in a range of about 0.3 volts to 0.7 volts.

In another embodiment, the semiconductor device is an SRAM memory device and the threshold voltage of the first transistor is about 0.5 volts and the threshold voltage of the second transistor is about 0.7 volts.

In another embodiment, two of the first transistors are located adjacent each other in the horizontal direction in the first region, and wherein the two first transistors share a common drain region.

In another embodiment, an outer surface of the lateral channel region opposite the side of the gate electrode is adjacent an insulative region. In another embodiment, the insulative region comprises a trench isolation region.

In another aspect, the present invention is directed to a method of forming a semiconductor device. A first transistor is provided in a first region of a semiconductor layer. A cavity is provided that extends in a vertical direction in the semiconductor layer. A first gate dielectric is provided at a lower portion and inner sidewalls of the cavity. A gate electrode is provided that fills a remaining portion of the cavity, the gate electrode extending in the vertical direction. A source region and a drain region are provided in the semiconductor layer that are arranged at opposite sides of the gate electrode in a horizontal direction. A lateral channel region of the semiconductor layer is provided at a side of the gate electrode in a lateral direction that extends in the horizontal direction between the source region and the drain region. A second transistor is provided in a second region of the semiconductor layer, the second transistor comprising a planar transistor.

In one embodiment, providing the second transistor comprises: providing a second gate dielectric on the semiconductor layer; providing a gate electrode on the second gate dielectric; and providing a first channel region in the semiconductor layer that lies below a gate electrode and not at a lateral side portion of the gate electrode in a lateral direction that extends in the horizontal direction between the source region and the drain region.

In another embodiment, the first region is a memory cell region of the semiconductor device and the second region is a peripheral region of the semiconductor device.

In another embodiment, the method further comprises providing an isolation region between the first transistor and the second transistor.

In another embodiment, the method further comprises providing in the first transistor a lower channel region that extends under the gate electrode between the source region and the drain region of the first transistor.

In another embodiment, the semiconductor layer comprises a semiconductor substrate. In another embodiment, the semiconductor layer is one selected from the group consisting of SOI (silicon-on-insulator), SiGe (silicon germanium), and SGOI (silicon germanium on insulator) layers.

In another embodiment, providing the lateral channel region provides a lateral channel region of a height in the vertical direction ranging between about 500 and 2000 Angstroms, for example, of a height in the vertical direction ranging between about 1000 and 1500 Angstroms.

In another embodiment, providing the lateral channel region provides a lateral channel region of a thickness in the lateral direction less than about 200 Angstroms, for example, of a thickness in the lateral direction ranging between about 10 and 150 Angstroms.

In another embodiment, the lateral channel region is of a thickness that is selected as a function of a desired threshold voltage of the first transistor.

In another embodiment, the lateral channel region of the first transistor comprises a first lateral channel region and a second lateral channel region at opposite sides of the gate electrode, each extending in a horizontal direction between the source region and the drain region.

In another embodiment, the method further comprises providing a first gate dielectric between the gate electrode of the first transistor and the source and drain regions and between the gate electrode of the first transistor and the lateral channel region.

In another embodiment, the method further comprises providing a second dielectric between a gate electrode and a channel region of the second transistor and wherein the second dielectric is of a different thickness than the first dielectric.

In another embodiment, the method further comprises providing a second dielectric between a gate electrode and a channel region of the second transistor and wherein the second dielectric is of a different material than the first dielectric.

In another embodiment, providing the gate electrode comprises providing a first portion that extends into the semiconductor layer in the vertical direction and a second portion that extends on the semiconductor layer in the horizontal or lateral directions. In another embodiment, the first portion is formed of a material that is different than the second portion. In another embodiment, the gate electrode has a T-shaped cross-section. In another embodiment, the material of the first portion has a direct effect on a threshold voltage of the first transistor. In another embodiment, the material of the first portion and the material of the second portion comprise metal and polysilicon respectively.

In another embodiment, a threshold voltage of the first transistor and a threshold voltage of the second transistor are different.

In another embodiment, the semiconductor device is a DRAM memory device and the threshold voltage of the first transistor is about 0.7 volts and the threshold voltage of the second transistor is in a range of about 0.3 volts to 0.7 volts.

In another embodiment, the semiconductor device is an SRAM memory device and the threshold voltage of the first transistor is about 0.5 volts and the threshold voltage of the second transistor is about 0.7 volts.

In another embodiment, the method further comprises providing two of the first transistors located adjacent each other in the horizontal direction in the first region, and wherein the two first transistors share a common drain region.

In another embodiment, an outer surface of the lateral channel region opposite the side of the gate electrode is adjacent an insulative region. In another embodiment, the insulative region comprises a trench isolation region.

In another aspect, the present invention is directed to a method of foaming a semiconductor device. The method includes defining a first active region and a second active region of a common semiconductor layer by using a first mask layer pattern and a second mask layer pattern respectively. The first mask layer pattern is etched in the first active region to reduce a width of the first mask layer pattern in a lateral direction by a first distance. A third mask layer is provided on the first active region to at least a level of the first mask layer pattern. The first mask layer pattern is removed in the first active region. A vertical opening is formed in a vertical direction of the semiconductor layer in the first active region using the third mask layer as an etch mask, sidewalls of the vertical opening having adjacent source and drain regions of the first active region in a horizontal direction and having at least one adjacent vertically oriented thin body channel region of the first active region along a sidewall of the vertical opening in the lateral direction. A first gate dielectric is provided on a bottom and the sidewalls of the vertical opening in the first active region. A first gate electrode is provided in a remaining portion of the opening on the gate dielectric in the first active region, to form a first transistor having the vertically oriented thin body channel region in the first active region. The second mask layer is removed to expose a surface of the semiconductor layer in the second active region. A second gate dielectric is provided on the semiconductor layer in the second active region. A second gate electrode is provided on the second gate dielectric in the second active region, to form a second transistor in the second active region, the second transistor comprising a planar transistor.

In one embodiment, the method further comprises forming trenches in the semiconductor layer to define the first active region and the second active region.

In another embodiment, the thickness of the vertically oriented thin body channel region is determined according to the first distance of the reduced width of the first mask layer pattern.

In another embodiment, the vertically oriented thin body channel region is formed in the first active region of the semiconductor layer between one of the trenches and the vertical opening.

In another embodiment, the method further comprises doping the vertically oriented thin body channel region to form a lateral channel region.

In another embodiment, the method further comprises doping the first active region under the vertical opening to form a lower channel region.

In another embodiment, the method further comprises doping the source and drain regions of the first active region.

In another embodiment, the method further comprises forming a buffer layer on the first active region and the second active region between the semiconductor layer and the first mask pattern, and wherein the buffer layer protects an upper surface of the first active region during etching the first mask layer pattern.

In another embodiment, etching the first mask layer pattern further comprises etching the first mask layer pattern in the second active region.

In another embodiment, providing vertical openings comprises providing multiple vertical openings using the second mask layer as an etch mask.

In another embodiment, providing the first gate electrode comprises providing a first portion that extends into the semiconductor layer in the vertical direction and providing a second portion that extends on the semiconductor layer in the horizontal or lateral directions and wherein the first portion is formed of a material that is different than the second portion.

In another embodiment, the material of the first portion has a direct effect on a threshold voltage of the first transistor.

In another embodiment, the material of the first portion and the material of the second portion comprise metal and polysilicon respectively.

In another embodiment, the first active region is a memory cell region of the semiconductor device and wherein the second active region is a peripheral region of the semiconductor device.

In another embodiment, the semiconductor layer comprises a semiconductor substrate.

In another embodiment, the semiconductor layer is one selected from the group consisting of SOI (silicon-on-insulator), SiGe (silicon germanium), and SGOI (silicon germanium on insulator) layers.

In another embodiment, the vertically oriented thin body channel region is of a thickness that is selected as a function of a desired threshold voltage of the first transistor.

In another embodiment, the vertically oriented thin body channel region of the first transistor comprises a first lateral channel region and a second lateral channel region at opposite sides of the gate electrode in the lateral direction, each extending in a horizontal direction between the source region and the drain region.

In another embodiment, the second gate dielectric is of a different thickness than the first gate dielectric.

In another embodiment, the second gate dielectric is of a different material than the first gate dielectric.

In another embodiment, a threshold voltage of the first transistor and a threshold voltage of the second transistor are different.

In another embodiment, the method further comprises providing two of the first transistors located adjacent each other in the horizontal direction in the first region, and wherein the two first transistors share a common drain region.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 2A through 11A are perspective views illustrating methods for fabricating a semiconductor device according to some embodiments of the present invention shown in FIG. 1A;

FIGS. 2B through 11B are cross-sectional views illustrating methods for fabricating a semiconductor device according to some embodiments of the present invention corresponding to FIGS. 2A through 11A, taken along a line I-I in FIG. 1A;

FIGS. 2C through 11C are cross-sectional views illustrating methods for fabricating a semiconductor device according to some embodiments of the present invention corresponding to FIGS. 2A through 11A, taken along line II-II in FIG. 1A; and FIGS. 12A through 19A are overhead views illustrating methods for fabricating a semiconductor device according to further embodiments of the present invention;

FIGS. 12B through 19B are cross-sectional views illustrating methods for fabricating a semiconductor device according to some embodiments of the present invention corresponding to FIG. 12A through FIG. 19A, taken along line I-I in FIG. 12A; and FIGS. 12C through 19C are cross-sectional views illustrating methods for fabricating a semiconductor device according to some embodiments of the present invention corresponding to FIG. 12A through FIG. 19A, taken along line II-II in FIG. 12A.

FIGS. 22A through 32A are top views of a method for fabrication of the semiconductor device of FIGS. 20 and 21A through 21C. FIGS. 22B through 32B and FIGS. 22C through 32C are cross-sectional views corresponding to FIGS. 22A through 32A, taken along lines B-B' and C-C' of the semiconductor device of FIG. 20, respectively.

FIGS. 35A through 38A are top views of a method for fabrication of the embodiment of FIGS. 33 and 34A through 34C. FIGS. 35B through 38B and FIGS. 35C through 38C are cross-sectional views corresponding to FIGS. 35A through 38A, taken along lines B-B' and C-C' in FIG. 33, respectively.

FIGS. 41A through 43A are top views of a method for fabrication of the embodiment of FIGS. 39 and 40A through 40C. FIGS. 41B through 43B and FIGS. 41C through 43C are cross-sectional views corresponding to FIGS. 41A through 43A, taken along lines B-B' and C-C' in FIG. 39, respectively.

DETAILED DESCRIPTION OF PREFERRED EMBODIMENTS

Figure 1A:
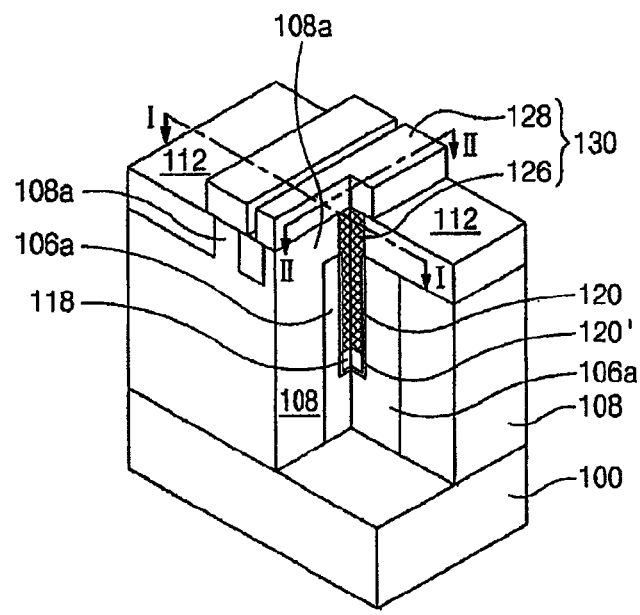
FIG. 1A is a perspective view of a semiconductor device according to some embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will also be understood that the term "and/or" as used herein refers to and encompasses any and all possible combinations of one or more of the associated listed items.

Furthermore, relative terms such as beneath may be used herein to describe one layer or region's relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region funned by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

The present invention relates to field effect transistors, and more specifically to thin body transistors without an SOI substrate. A conventional thin body transistor on an SOI substrate may have a horizontal channel, and may include a buried oxide layer (BOX), a thin body, and a gate electrode which are stacked in sequential order on the substrate. However, a thin body transistor according to some embodiments of the present invention has a vertical channel (i.e., a vertical thin body), and has a structure such that a portion of the gate electrode is vertically oriented to fill a region between portions of the vertical thin body (i.e., the gate electrode is surrounded by the vertical thin body). In other words, at least a portion of the vertically oriented gate electrode is inside a cavity within the thin body. In other embodiments, the gate electrode may include a horizontally or laterally oriented portion and a vertically oriented portion (forming the shape of a 'T'), and the vertical thin bodies may surround the vertically oriented portion of the gate electrode.

Figure 1B:
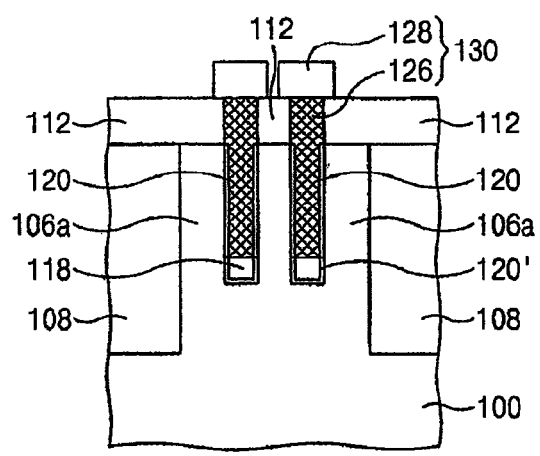
FIG. 1B is a cross-sectional view of a semiconductor device according to some embodiments of the present invention taken along line I-I in FIG. 1A.
Figure 1C:
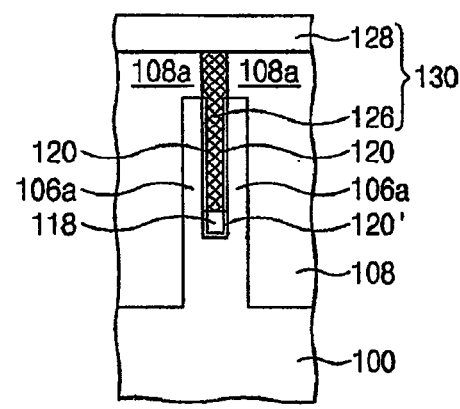
FIG. 1C is a cross-sectional view of a semiconductor device according to some embodiments of the present invention taken along line II-II in FIG. 1A.

Vertical thin body transistors according to some embodiments of the present invention will now be described with reference to the accompanying drawings. FIG. 1A is a perspective view illustrating a field effect transistor according to some embodiments of the present invention. FIGS. 1B and 1C are cross-sectional views illustrating the field effect transistor of FIG. 1A, taken along lines I-I and II-II of FIG. 1A.

Referring to FIGS. 1A through 1C, a transistor according to some embodiments of the present invention includes a gate line 130 and a vertically protruding thin body portion 106a of the semiconductor substrate 100 where an inversion layer channel may be formed. The gate line 130 includes a laterally oriented portion 128 and a vertically oriented portion 126, forming a T-shape. A first opening or cavity 116 is defined within the vertical thin body 106a by opposing sidewalls of the vertically protruding portion of the substrate 100. In other words, the first opening or cavity 116 may be defined by a U-shaped portion of the substrate 100. Upper insulating layers 112 and 108a are formed on the vertical thin body 106a. The upper insulating layers 112 and 108a have a second opening 114 aligned with the first opening or cavity 116. The upper insulating layer 108a may be a device isolating layer. The vertically oriented portion 126 of the gate line 130 is at least partially surrounded by the vertical thin body 106a and the upper insulating layers 112 and 108a. In other words, the vertically extending portion 126 of the gate line 130 fills the first opening or cavity 116 in the vertical thin body 106a and the second opening 114 in the upper insulating layers 112 and 108a. An upper portion of the vertically oriented portion 126 of the gate line 130 may be higher than the vertical thin body 106a. Also, the upper portion of the vertically oriented portion 126 of the gate line 130 may have a width greater than a lower portion of the vertically oriented portion 126 of the gate line 130 inside the opening or cavity 116. The laterally oriented portion 128 of the gate line 130 covers the vertically oriented portion 126 of the gate line 130, and passes over a top surface of the upper insulating layers 112 and 108a.

The vertically oriented portion 126 of the gate line 130 may be formed of silicide or polysilicon. The laterally oriented portion 128 of the gate line 130 may be formed of polysilicon, metal (such as tungsten) or silicide. Silicides include, for example, tungsten silicide, nickel silicide, titanium silicide, chrome silicide, etc.

In addition, the width of the laterally oriented portion 128 of the gate line 130 is wider than that of vertically oriented portion 126 of the gate line 130.

A gate insulating layer 120 is formed on the bottom and on inner sidewalls of the first opening or cavity 116.

In one embodiment, an optional lower insulating layer 118 is formed between the bottom of the vertically extending portion 126 of the gate line 130 and the gate insulating layer 120' on a bottom of the first opening or cavity 116. In such a case, an upper region of the thin body 106a adjacent to both sidewalls of the vertically extending portion 126 of the gate line 130 provides a region where an inversion-layer channel may be formed when the transistor is disposed in a forward on-state mode of operation. However, an inversion-layer channel may not be formed at the lower portion of the thin body 106a due to the lower insulating layer 118.

Now referring to FIGS. 2A through 11A, FIGS. 2B through 11B and FIGS. 2C through 11C, a method for fabricating semiconductor devices according to embodiments of the present invention illustrated in FIGS. 1A through 1C will be described. FIGS. 2B through 11B and FIGS. 2C through 11C are cross-sectional views corresponding to FIGS. 2A through 11A, taken along line I-I and line II-II in FIG. 1A, respectively.

Figure 2A:
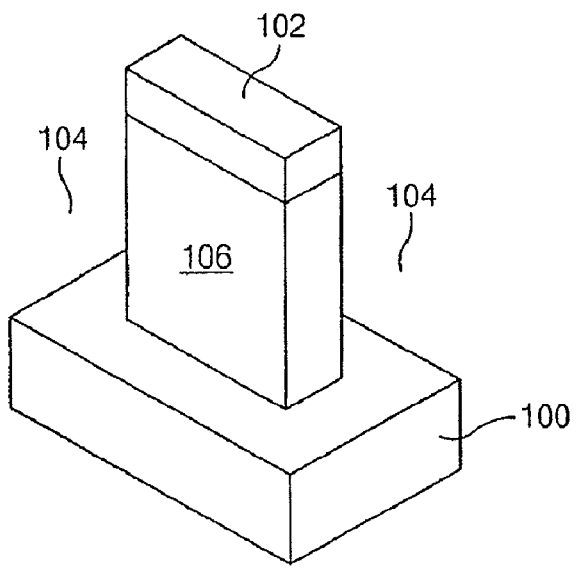
Figure 2B:
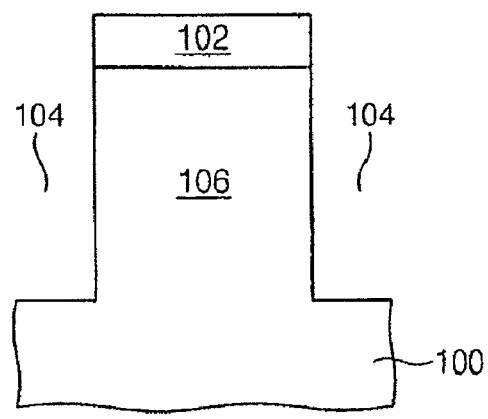
Figure 2C:
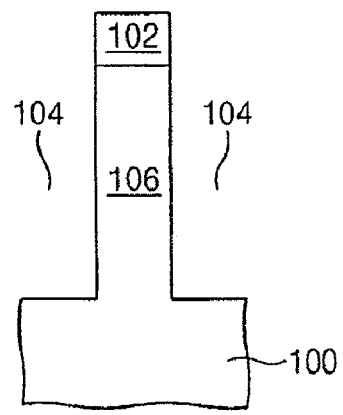

Referring to FIGS. 2A through 2C, a mask pattern 102 is formed on a semiconductor substrate 100. The exposed substrate is then etched using the mask pattern 102 as an etch mask to form a trench 104 and to define an active region 106 where a thin-body channel region is to be formed. Although only one active region is illustrated, a plurality of active regions may be formed simultaneously in a predetermined arrangement on the substrate 100. In addition, even though a top portion of the active region 106 is illustrated as rectangular, the top portion may be formed to various shapes.

Figure 3A:
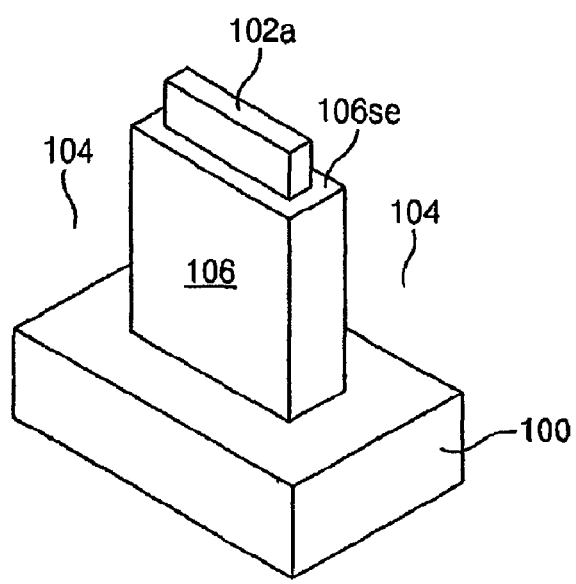
Figure 3B:
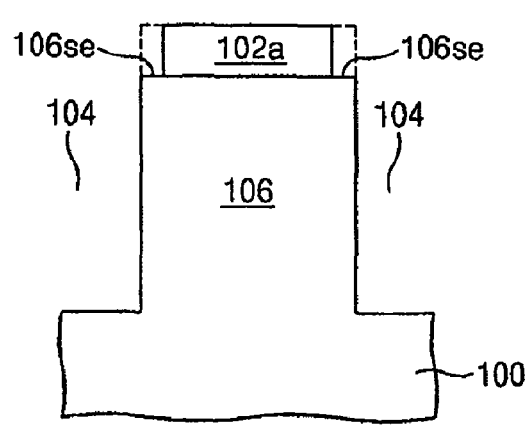
Figure 3C:
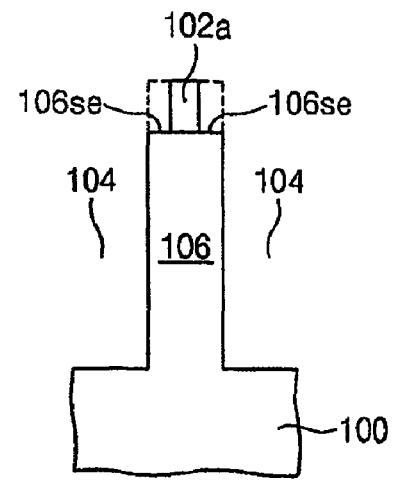

The mask pattern 102 may be formed by stacking a silicon oxide layer and a silicon nitride layer. In such a case, the silicon oxide layer may be formed by thermally oxidizing a substrate, and the silicon nitride layer may be formed using chemical vapor deposition (CVD). Referring to FIGS. 3A through 3C, a portion of mask pattern 102 is removed to form a shrunken mask pattern 102a, exposing an edge 106se at the top surface of the active region 106. The width of edge 106se may determine a width of the thin body (i.e., the width of the channel). In other words, a predetermined portion of the mask pattern 102 may be removed to form a thin body portion of the substrate 100 having a desired thickness. For example, using an etchant, a portion of the mask pattern 102 may be removed. A phosphoric acid solution may be used to remove the silicon nitride layer, and a fluoric acid solution may be used to remove the silicon oxide layer. Other etchants well known to those skilled in the art may also be used.

Figure 4A:
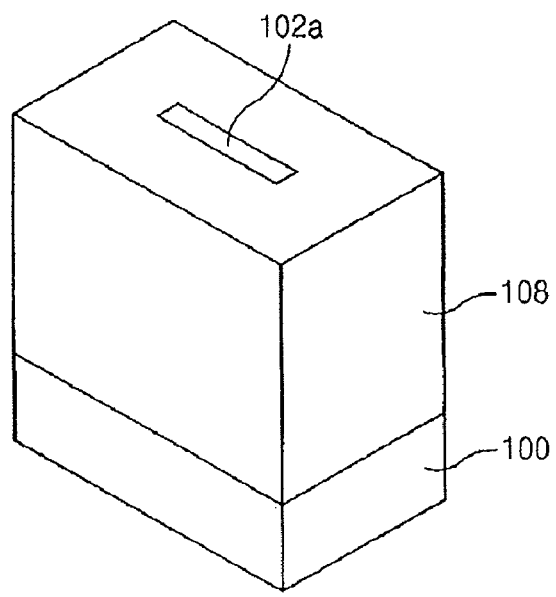
Figure 4B:
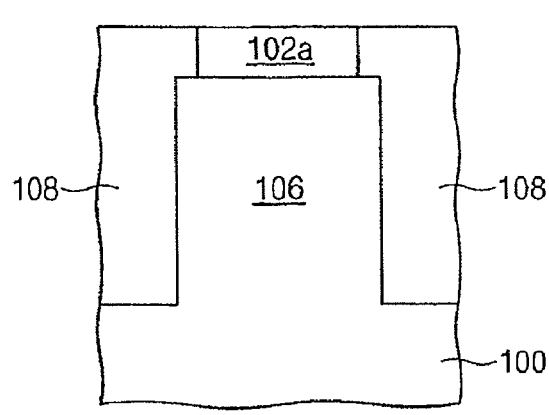
Figure 4C:
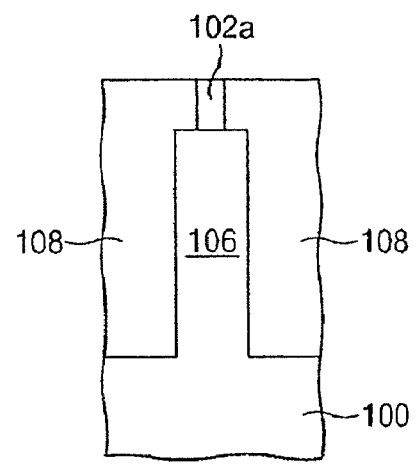

Referring to FIGS. 4A through 4C, a trench 104 is filled with insulating material to form a device isolating layer 108. More specifically, after the insulating material is formed to fill the trench 104, the insulating material is removed until the shrunken mask pattern 102a is exposed, for example, by a planarization process such as chemical-mechanical polishing (CMP). The insulating material may be silicon oxide. Although not illustrated in the drawings, a thermal oxidation process may be used to cure etching damage to the substrate, and a silicon nitride layer may be formed on inner sidewalls of the trench as an oxidation barrier layer prior to filling the trench with the insulating material.

Figure 5A:
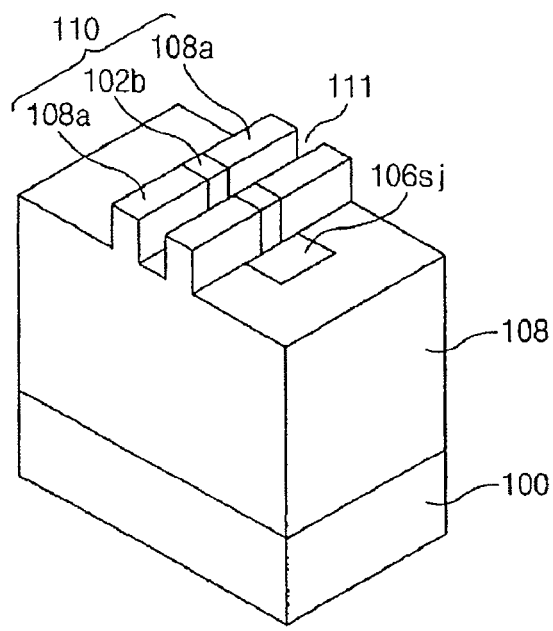
Figure 5B:
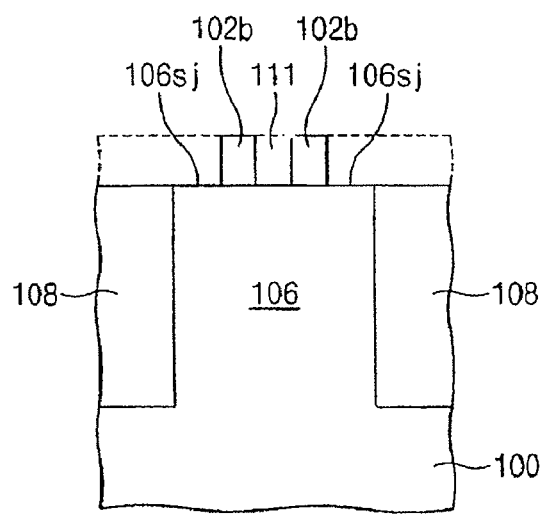
Figure 5C:
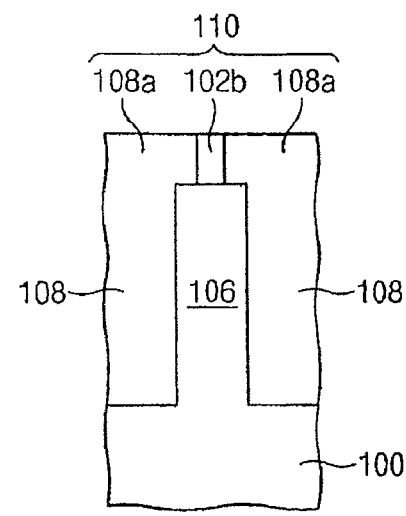

Referring to FIGS. 5A through 5C, the device isolating layer 108 and the shrunken mask pattern 102a are patterned to form a dummy gate line 110 over the active region 106. More specifically, an etch mask (not shown) defining the dummy gate line 110 is formed on the device isolating layer 108 and the shrunken mask pattern 102a. The portions of the device isolating layer 108 and the shrunken mask pattern 102a that are exposed by the etch mask are etched until a top surface 106sj of the active region 106 is exposed. The dummy gate line 110 comprises a patterned shrunken mask pattern 102b and a patterned device isolating layer 108a (i.e., a portion of the device isolating layer 108 extending over the active region 106). The source/drain regions for the transistor may be formed at the exposed top portions 106sj of the active region 106 in a subsequent process.

Figure 6A:
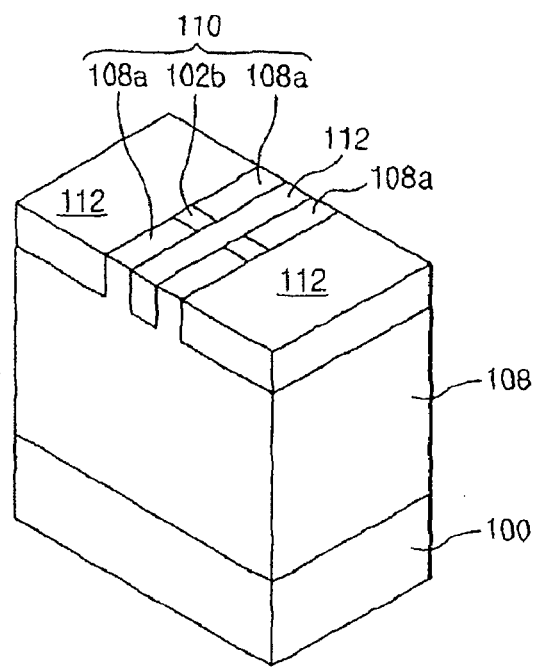
Figure 6B:
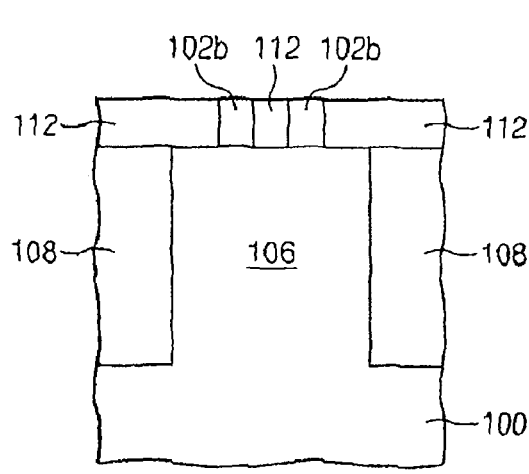
Figure 6C:
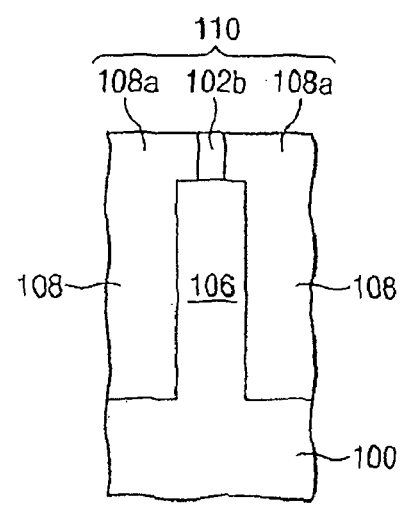

After the etch mask for defining the dummy gate line 110 is removed, an insulating layer 112 is formed to fill the space 111 between the dummy gate lines 110, as illustrated in FIGS. 6A through 6C. More specifically, insulating material is formed on the substrate 100 over the dummy gate line 110 to fill the space 111 between the dummy gate lines 110, and then a planarization process is performed until the shrunken mask pattern 102b is exposed. The insulating layer 112 may be formed of silicon oxide. As such, the shrunken mask pattern 102b portion of the dummy gate line 110 remains on the top surface of the active region 106, surrounded by the patterned device isolating layer 108a and the insulating layer 112. The insulating layer 112 may serve as a buffer layer in a subsequent ion-implantation process for forming source/drain regions.

Figure 7A:
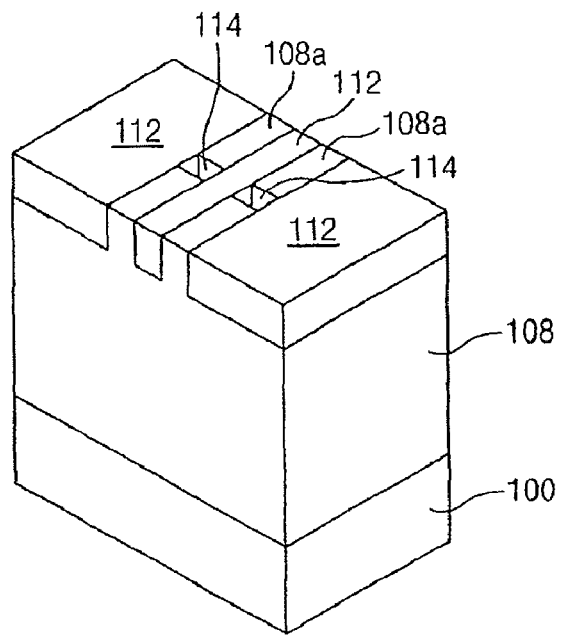
Figure 7B:
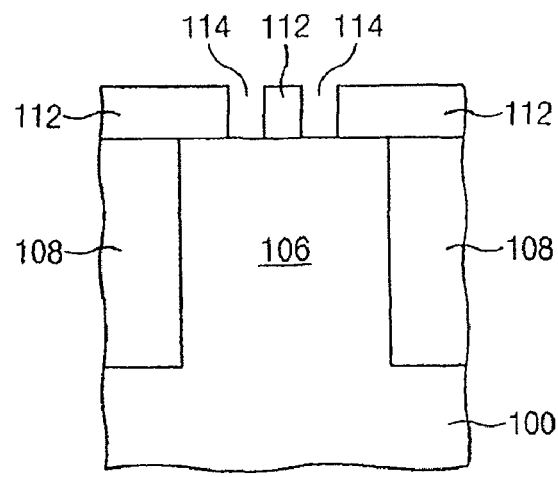
Figure 7C:
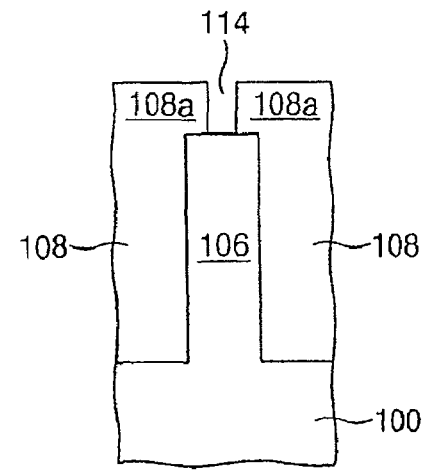

Referring to FIGS. 7A through 7C, the shrunken mask pattern 102b portion of the dummy gate line 110 is removed after an ion-implantation process is performed. The insulating layer 112 and the device isolating layer 108a thereby define a second opening 114. The second opening 114 exposes a portion of top surface of the active region 106.

Figure 8A:
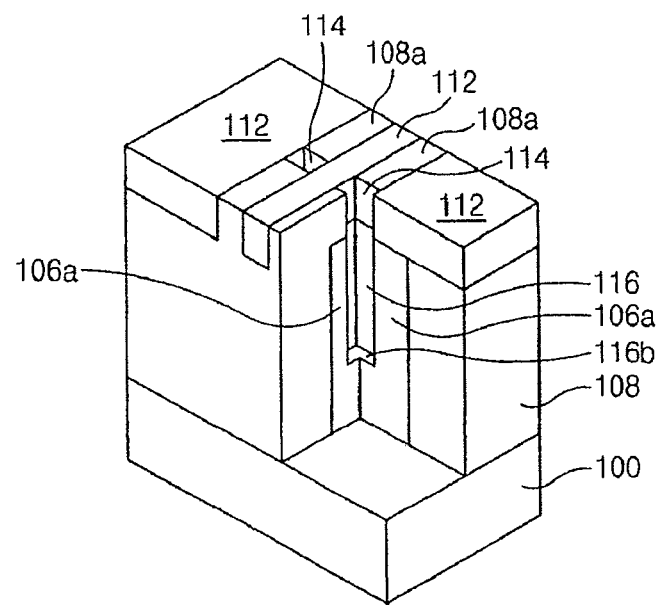
Figure 8B:
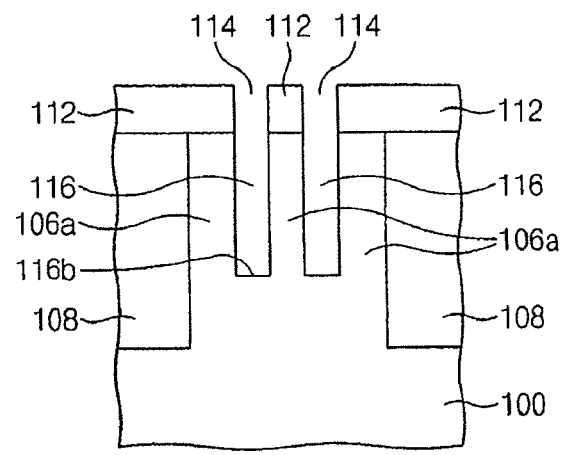
Figure 8C:
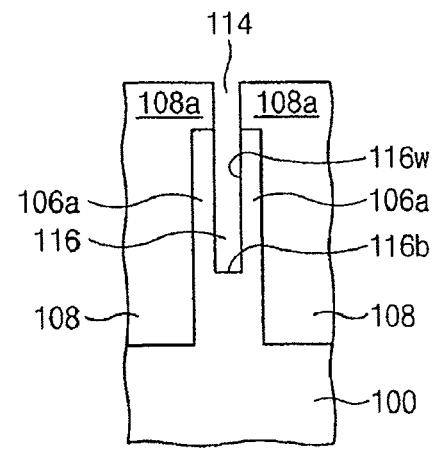

Referring to FIGS. 8A through 8C, the active region 106 exposed by the second opening 114 is etched to a predetermined depth to form a thin-body portion 106a of the substrate 100 surrounding a first opening or cavity 116. In other words, the first opening or cavity 116 is defined within the vertical thin body 106a by opposing sidewalls of the vertically protruding portion of the substrate 100. A width of the resultant thin body 106a depends on the amount of the mask pattern 102 that is removed. In other words, the amount of the mask pattern 102 that is removed may be adjusted so that the thin body may be formed to a desired width.

The ion implantation process may optionally be performed after the shrunken mask pattern 102b is removed or after the first opening or cavity 116 is formed.

Figure 9A:
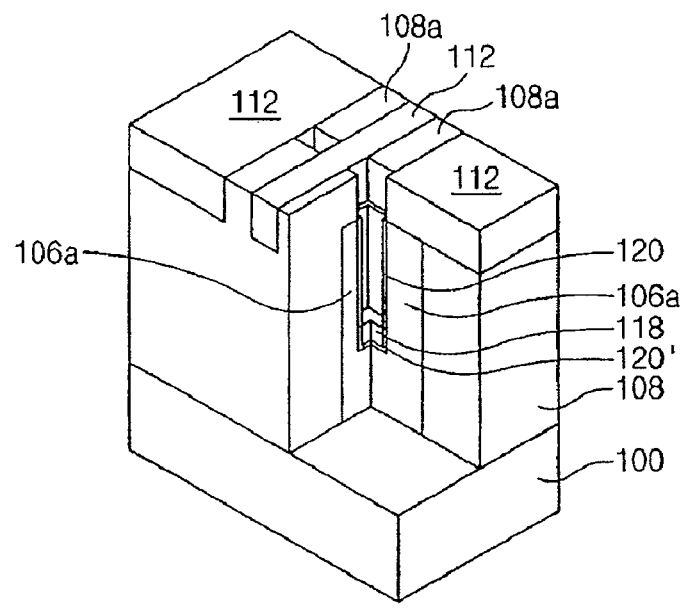
Figure 9B:
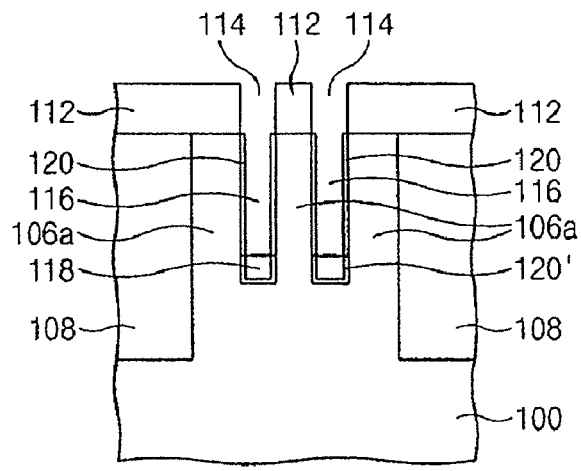
Figure 9C:
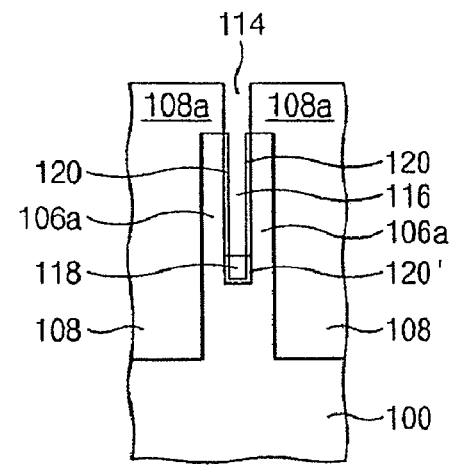

Referring to FIGS. 9A through 9C, gate insulating layers 120' and 120 are formed in the first opening or cavity 116 (i.e., on a bottom 116b and both sidewalls 116w of the first opening or cavity 116, respectively), and a lower insulating layer 118 is optionally formed on the gate insulating layer 120' at the bottom 116b of the first opening or cavity 116. The lower insulating layer 118 may fill a lower portion of the first opening or cavity 116. As such, a lower portion of the thin body channel region 106a may not serve as a channel due to the lower insulating layer 118. In other words, the lower insulating layer 118 may prevent an inversion layer channel from being formed in the lower portion of the thin body channel region 106a. The lower insulating layer 118 may be formed of a silicon nitride layer, a non-doped silicon layer or a silicon oxide layer.

More specifically, after forming the first opening or cavity 116, a thermal oxidation process is performed to form a silicon oxide layer 120' in the first opening or cavity 116 (i.e. on the sidewalls and the bottom of the first opening or cavity 116). A lower insulating material is then formed on the insulating layer 112, the device isolation layer 108a, and the silicon oxide layer 120' in the first opening or cavity 116, so as to fill the first opening or cavity 116 and the second opening 114. Then, the lower insulating material is selectively removed (i.e. the lower insulating material is recessed in the first opening or cavity 116) to form a lower insulating layer 118 that fills a portion of the first opening or cavity 116. For example, an etch back process may be applied to selectively etch the lower insulating material to form the lower insulating layer 118 on the bottom of the first opening or cavity 116. The silicon oxide layer 120' on the sidewalls of the first opening or cavity 116 exposed by the lower insulating layer 118 is then removed, leaving a portion of the silicon oxide layer 120' under the lower insulating layer 118.

Still referring to FIGS. 9A through 9C, a gate insulating layer 120 is formed on the exposed sidewalls of the first opening or cavity 116 in the active region 106. The gate insulating layer 120 may be formed by a thermal oxidation process. If the lower insulting layer 118 is formed of silicon oxide, the silicon oxide layer 120' on the sidewalls of the first opening or cavity 116 may be removed when the lower insulating material is recessed.

In other embodiments, the lower insulating layer 118 is not formed on the bottom of the first opening or cavity 116. In such a case, a thermal oxidation process may be performed after forming the first opening or cavity 116 to form the gate insulating layer 120 on both sidewalls and the bottom of the first opening or cavity 116.

Figure 10A:
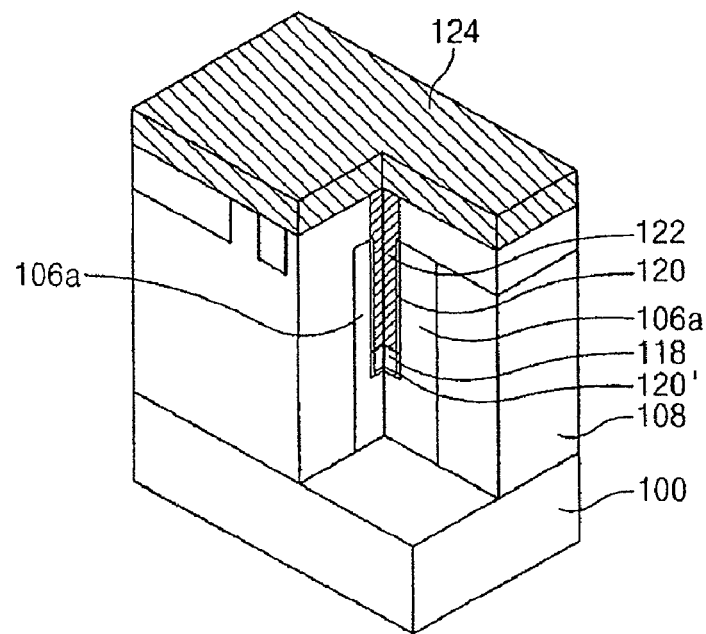
Figure 10B:
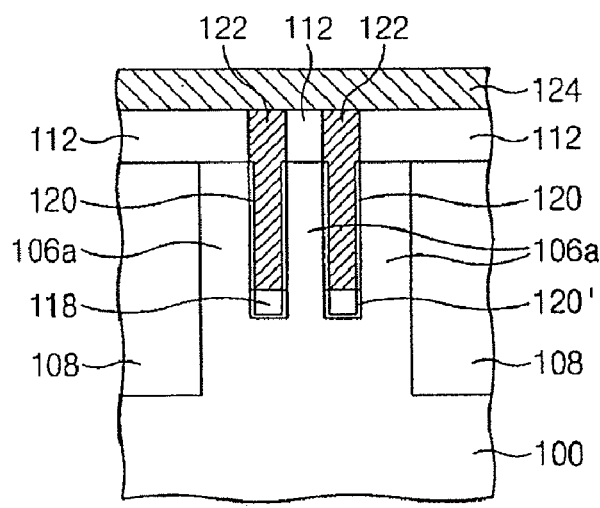
Figure 10C:
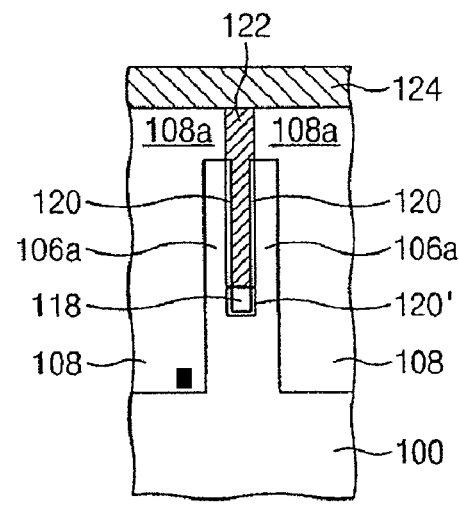

Referring to FIGS. 10A through 10C, a polysilicon layer 122 is formed to fill the first opening or cavity 116 and the second opening 114, and a heat-resistant metal layer 124 is formed on an entire surface of the substrate. The heat-resistant metal layer 124 may include, for example, nickel, chrome, titanium, etc.

Referring to FIGS. 11A through 11C, a thermal treatment process is applied to form a silicide layer in the first and second openings 116 and 114, forming a vertically oriented portion 126 of the gate line 130. The heat-resistant metal layer 124 is then removed. By controlling the thermal treatment process (e.g., the thickness of the heat-resistant metal layer 124, the duration of the process, etc.), the silicide layer may be formed only in the first opening or cavity 116, or in both the first and second openings 116 and 114.

A conductive layer is then formed and patterned to form a laterally oriented portion 128 of the gate line 130 as illustrated in FIGS. 1A through 1C. The conductive layer may be formed of polysilicon, heat-resistant metal, or tungsten.

An ion implantation process is performed to form source/drain regions in a subsequent process.

In the above method, the silicide layer that forms the vertically oriented portion 126 of the gate line 130 may be formed using chemical vapor deposition (CVD). More specifically, the gate insulating layer may first be formed, and then the silicide layer may be formed to fill the first and second openings using chemical vapor deposition. In alternate embodiments, the gate line 130 may be formed of polysilicon having a single layered structure. In such a case, a polysilicon layer is formed on the device isolating layer 108a and the insulating layer 112 to fill the first and second openings 116 and 114. The polysilicon layer is then patterned to form a vertically oriented portion and a laterally oriented portion simultaneously. Then, a tungsten or heat-resistant metal layer is formed and patterned to form the gate line 130.

When the vertically oriented portion 126 of the gate line 130 is formed of silicide, a potential advantage is that a gate doping process for forming a p-type transistor or an n-type transistor may not be required.

Referring now to FIGS. 12A through 18A, FIGS. 12B through 18B, and FIGS. 12C through 18C, methods of fabricating semiconductor devices according to further embodiments of the present invention will be described. FIGS. 12A through 18A are overhead views, and FIGS. 12B through 18B and FIGS. 12C through 18C are cross-sectional views corresponding to FIGS. 12A through 18A, taken along line I-I and line II-II in FIG. 12A, respectively.

First, referring to FIGS. 12A through 12C, a substrate is etched to a predetermined depth to form a trench and to define an active region 206 where a thin-body channel region is to be formed, using a mask pattern 202 formed on the substrate 200 in a method similar to that explained with reference to FIGS. 2A through 2C. After the forming the active region 206, a device isolating layer 208 is formed, filling the trench and electrically insulating the active region.

Figure 13A:
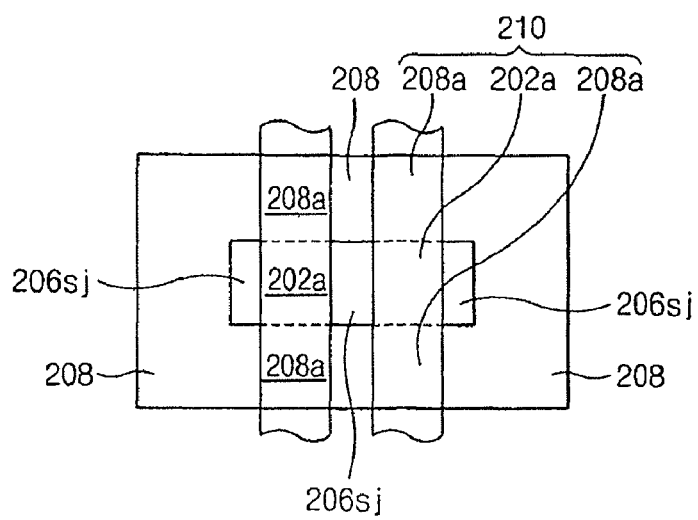
Figure 13B:
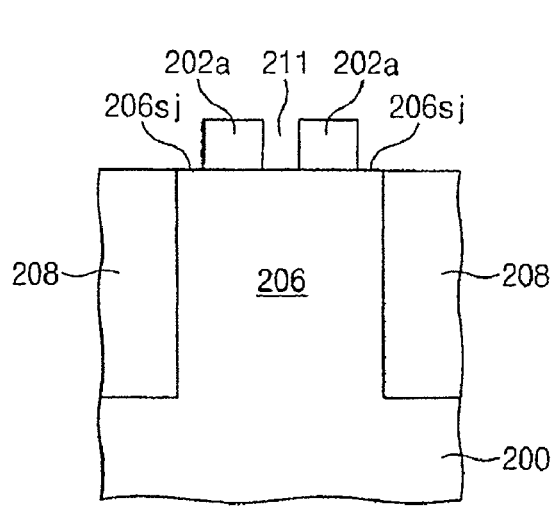
Figure 13C:
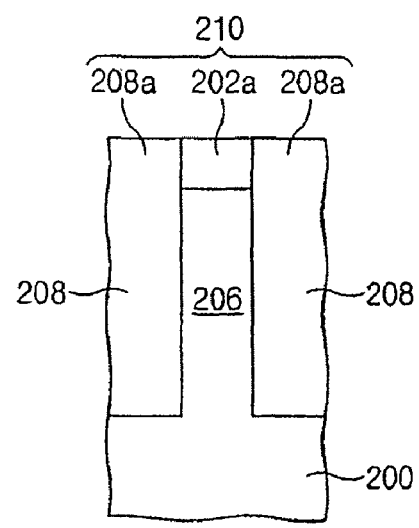

Referring to FIGS. 13A through 13C, the device isolating layer 208 and the mask pattern 202 are patterned until top portions 206sj of the active region are exposed, thereby forming dummy gate lines 210. The exposed top portions 206sj of the active region 206 may be where source/drain regions may be formed in a subsequent process.

Figure 14A:
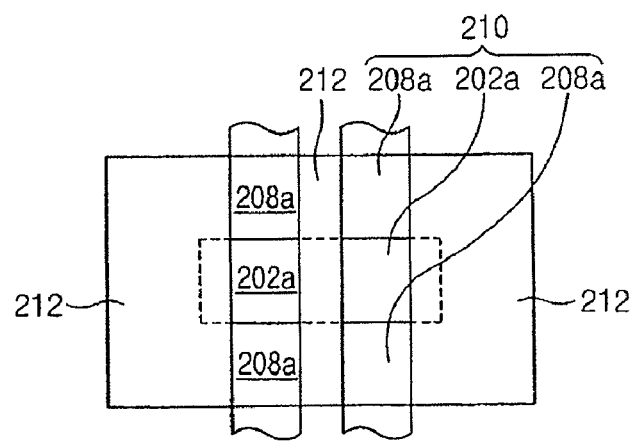
Figure 14B:
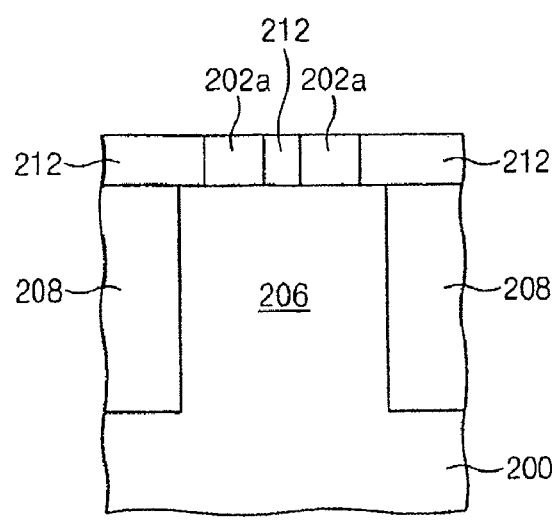
Figure 14C:
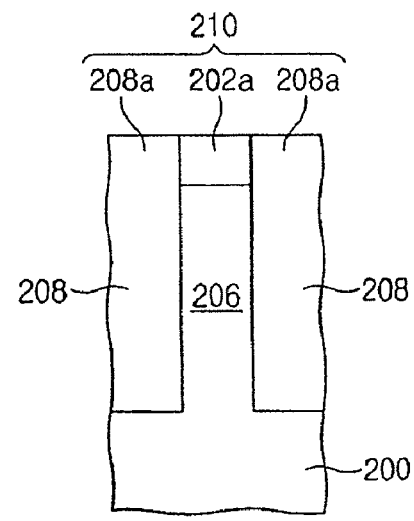

Referring to FIGS. 14A through 14C, an insulating layer 212 is formed to fill a region between the dummy gate lines 210. As such, a mask pattern 202a portion of the dummy gate line 210 is surrounded by the insulating layer 212 and the device isolating layer 208a, defined an "island" on the active region 206. In such a case, the insulating layer 212 may serve as a buffer layer in a subsequent ion-implantation process for forming source/drain regions.

Referring to FIGS. 15A through 15C, after the ion-implantation process is performed, the residual mask pattern 202a is removed to form a second opening 214, exposing a top surface 206s of the active region 206. The second opening 214 is defined by the insulating layer 212 and the device isolating layer 208a.

Figure 16A:
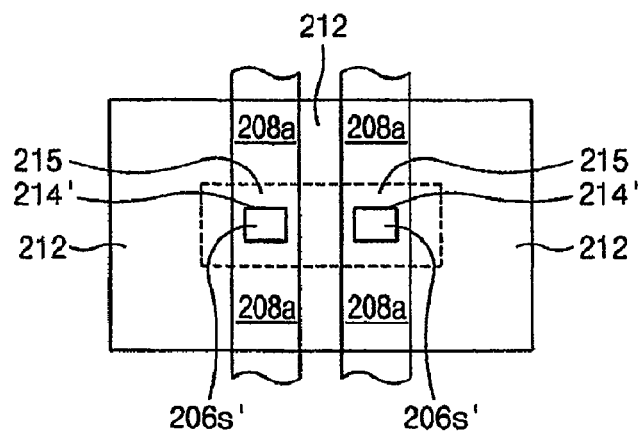
Figure 16B:
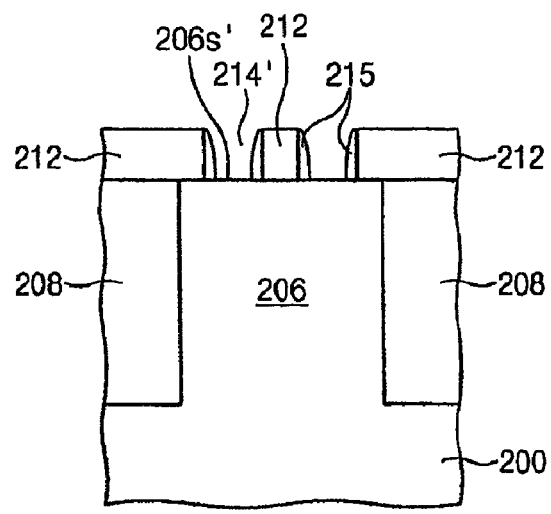
Figure 16C:
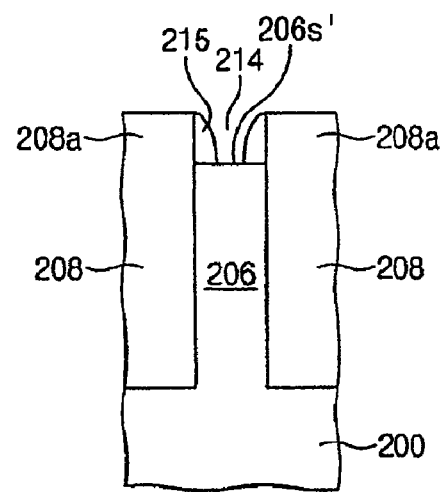

As illustrated in FIGS. 16A through 16C, spacers 215 are then formed on sidewalls of the second opening 214, thereby reducing the size of second opening 214 and forming a smaller second opening 214'. The width of the spacers 215 determines the channel width (i.e., the width of thin body channel region) that will be formed in a subsequent process. Therefore, by adjusting the width of spacers 215, the thin body channel region may be formed to a desired width. The spacers 215 may be formed by forming a silicon nitride layer using a thin film deposition technique, and etching back the silicon nitride layer. The spacers 215 may be formed of material having an etch selectivity with respect to silicon, such as silicon nitride or silicon oxide.

Figure 17A:
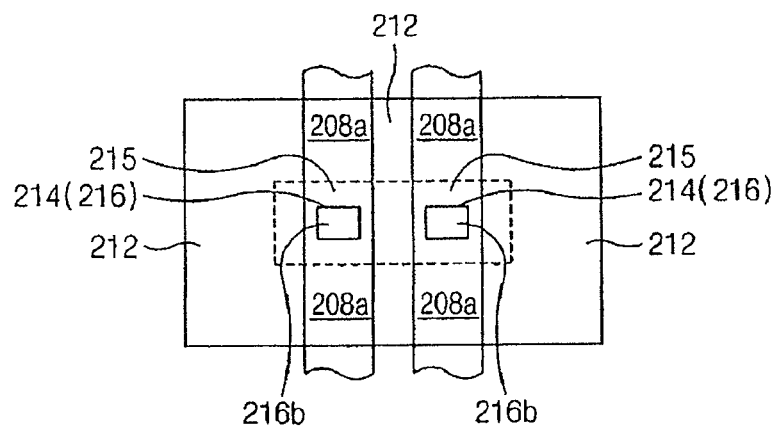
Figure 17B:
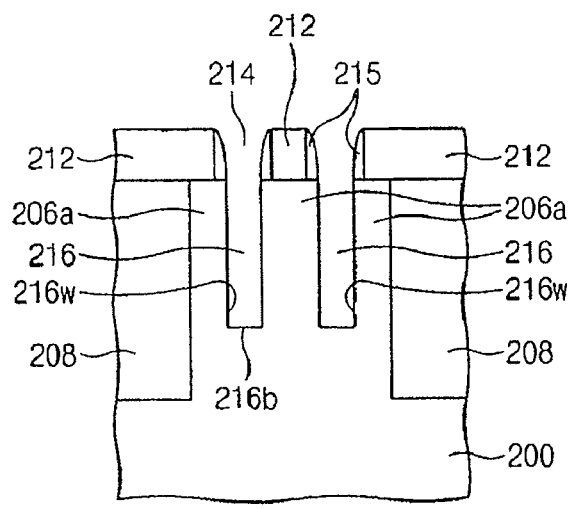
Figure 17C:
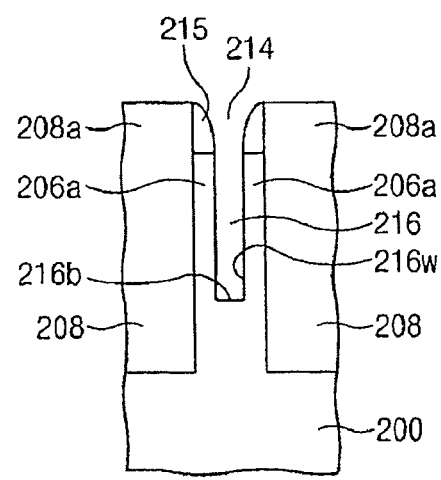

Referring to FIGS. 17A through 17C, the active region 206 exposed by the smaller second opening 214' is etched to a predetermined depth. As such, the active region 206 includes a first opening or cavity 216, and a thin body portion 206a of the substrate 200 is formed. An ion implantation process may be performed after the mask pattern 202a is removed or after the first opening or cavity 216 is formed.

Figure 18A:
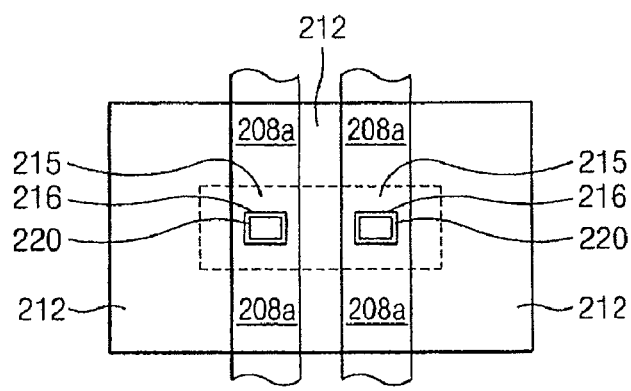
Figure 18B:
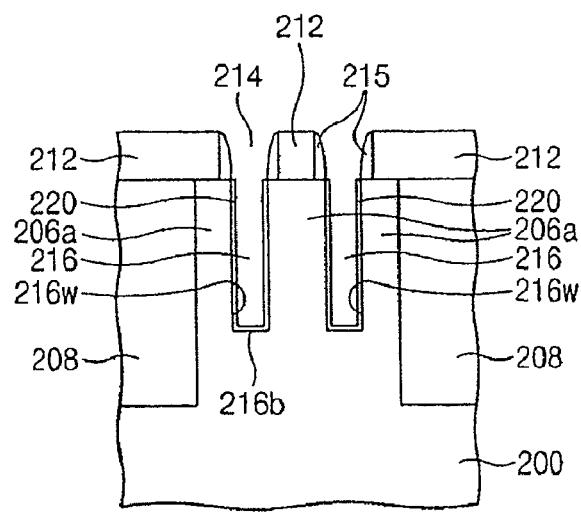
Figure 18C:
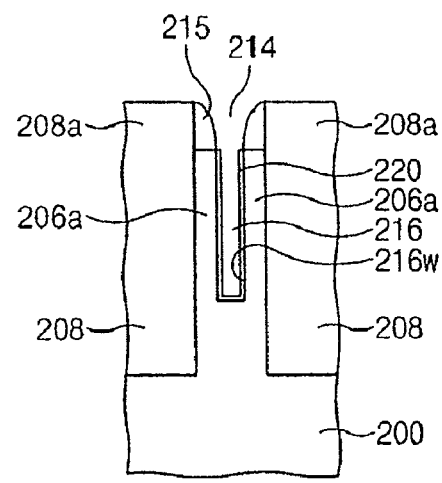

Referring to FIGS. 18A through 18C, a gate insulating layer 220 is formed on sidewalls 216w and the bottom 216b of the first opening or cavity 216. The gate insulating layer 220 may be formed using a thermal oxidation process.

Figure 19A:
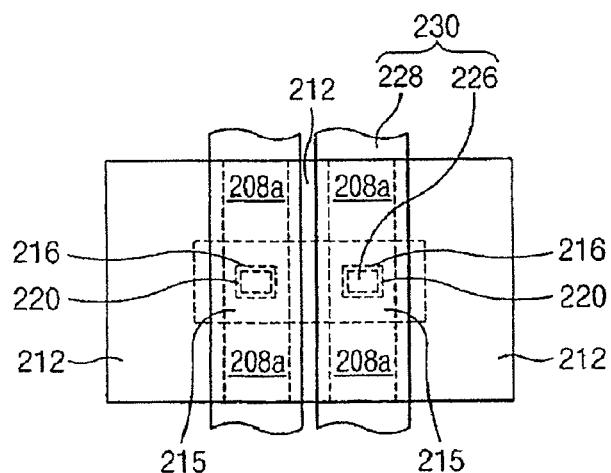
Figure 19B:
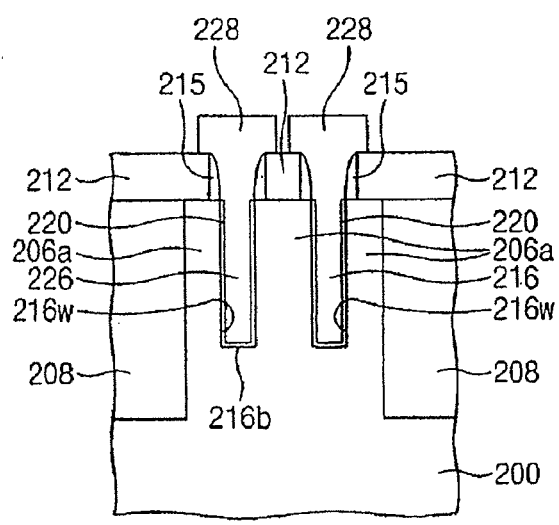
Figure 19C:
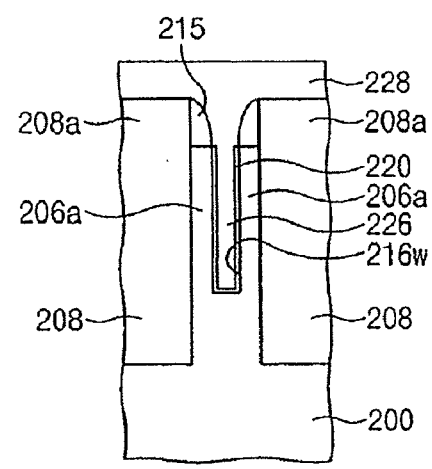

Next, referring to FIGS. 19A through 19C, a gate line 230 is formed. The gate line 230 crosses over (i.e. is formed on top of) the insulating layer 212 and the device isolating layer 208a, filling the first opening or cavity 216 and the smaller second opening 214'.

In other embodiments according to the present invention, a lower insulating layer may be formed on the bottom of the first opening or cavity 216. More specifically, after the first and second openings 216 and 214' are formed, a thermal oxidation process is performed and then a lower insulating material is formed to fill the first and second openings 216 and 214'. The lower insulating layer is then etched back to fill the bottom of the first opening or cavity 216. The thermal oxide layer formed on the sidewalls of the first opening or cavity 216 is then removed, and a gate insulating layer is formed thereon.

According to embodiments of the present invention, a vertically oriented thin body transistor may be formed without using an SOI substrate, but instead using conventional trench isolation techniques. As compared with SOI substrate, the fabrication process can be simplified, costs can be reduced, and short channel effects can be reduced. In addition, floating body effects can be suppressed and a back bias voltage can be applied. Moreover, the size of the mask pattern or the width of the spacers may be controlled to form a vertically oriented thin body having a desired thickness.

Based on the above discussion, a flash memory device according to embodiments of the present invention may have improved data loading speeds and reduced power loss with reduced current consumption, as input data may be selected through an I/O pad such that the data load path to be programmed may be enabled while the data load path to be erased may be disabled.

In certain applications of the vertically oriented thin body transistor, it is beneficial to have both planar-type memory devices and vertically oriented thin body devices formed on the same substrate. In a memory device, for example, it is desirable to have planar-type transistors in a peripheral region of the device, and vertically oriented thin body transistor devices in a cell region of the device. In this manner, the advantageous characteristics of each type of device can be applied to appropriate functions of the memory device.

Figure 20:
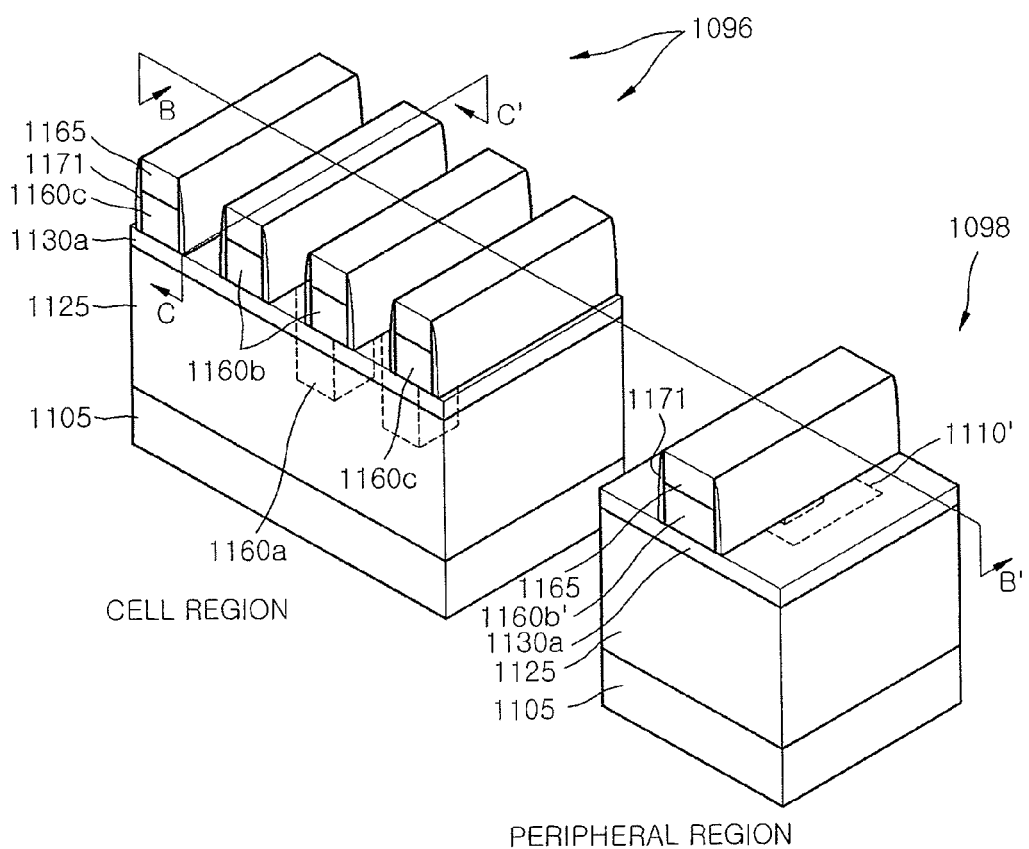
FIG. 20 is a perspective view of another embodiment of a semiconductor device in accordance with the present invention.
Figure 21A:
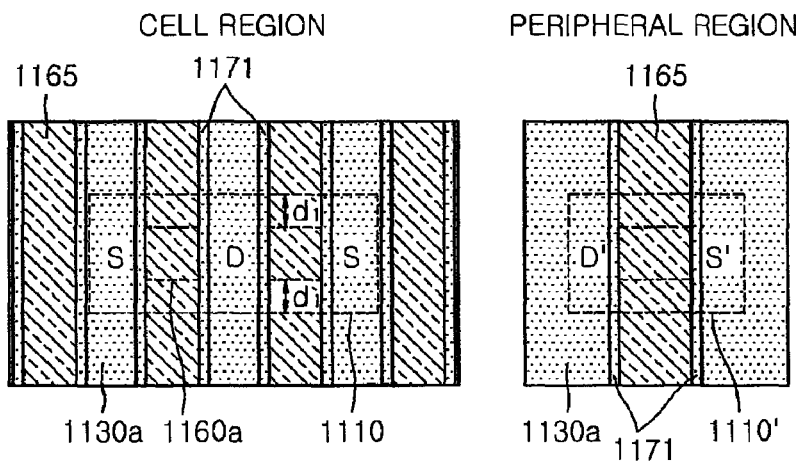
FIG. 21A is a top view of the semiconductor device of FIG. 20.
Figure 21B:
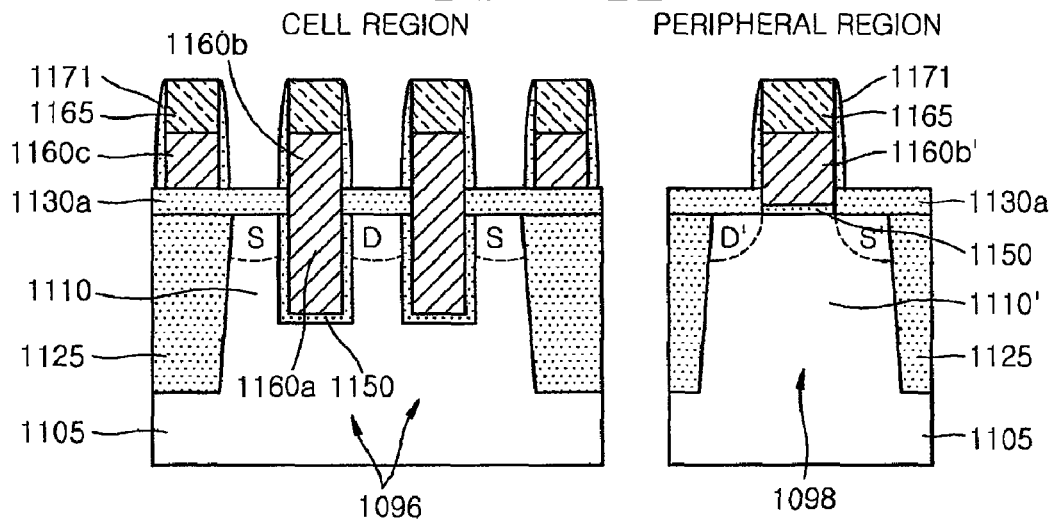
FIG. 21B is a cross-sectional view of the semiconductor device of FIG. 20 taken along line B-B' in FIG. 20.
Figure 21C:
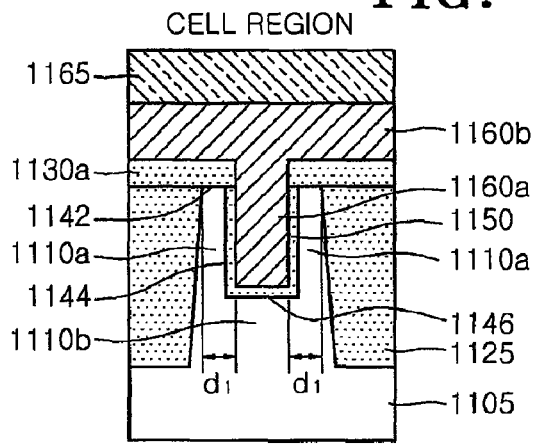
FIG. 21C is a cross-sectional view of the semiconductor device of FIG. 20 taken along line C-C' in FIG. 20.

FIG. 20 is a perspective view of another embodiment of a semiconductor device in accordance with the present invention. FIG. 21A is a top view of the semiconductor device of FIG. 20. FIG. 21B is a cross-sectional view of the semiconductor device of FIG. 20 taken along line B-B' in FIG. 20. FIG. 21C is a cross-sectional view of the semiconductor device of FIG. 20 taken along line C-C' in FIG. 20. For the purpose of discussion below, in the perspective view of FIG. 20, the vertical direction is the direction of the Z axis, the horizontal direction is the direction of the X axis, and the lateral direction is the direction of the Y axis.

With reference to FIGS. 20 and 21A-21C, the semiconductor device according to this embodiment of the present invention includes vertically oriented thin body transistors 1096 formed in a first region of the device, and conventional planar-type transistors 1098 formed in a second region of the device. In one embodiment, the semiconductor device comprises a memory device, the first region comprises a cell region of the memory device and the second region comprises a peripheral region of the memory device.

Both the vertically oriented thin body transistors 1096 formed in the cell region and the planar transistors 1098 formed in the peripheral region reside on a common semiconductor substrate 1105. In the cell region, a vertically oriented thin-body transistor 1096, for example of the type described above, is formed in accordance with the fabrication methods described above. The vertically oriented thin-body transistor 1096 includes a vertically oriented gate portion 1160a that extends into a vertically oriented cavity formed in the substrate 1105. Source and drain regions S, D are formed on opposite sides of the vertically oriented gate portion 1160a. A gate insulating layer 1150 is provided between the vertically oriented gate portion 1160a and the body of the substrate 1105. Trench isolation regions 1125 define active regions therebetween. An upper insulating layer 1130a lies on the resulting structure, and laterally oriented gate portions 1160b reside on the upper insulating layer. Together, the vertically oriented gate portions 1160a and the laterally oriented gate potions 1160b form a T-shaped structure. The laterally oriented gate portions 1160b, and other laterally oriented lines 1160c serve as interconnect lines for the gates, and other regions, of the transistors in the cell region of the device.

In the peripheral region, a planar transistor 1098 is provided. The planar transistor 1098 includes a laterally oriented gate portion 1160b' that extends in a lateral direction on the substrate 1105. Source and drain regions S', D' are formed on opposite sides of the gate 1160b', in an active region 1110' of the substrate 1105 defined between adjacent trench isolation regions 1125. A gate insulating layer 1150 is provided between the conductive gate 1160b' and the body of the substrate 1105 above a channel region of the device between the source S' and drain D'. An upper insulating layer 1130a lies on the substrate 1105, and trench isolation regions 1125.

In the vertically oriented thin body transistors 1096 of the cell region, the vertically oriented portion 1160a of the gate is at least partially surrounded by a vertical thin body 1110a of the substrate 1105. The vertical thin body 1110a forms a channel region of the device at front, rear, or both front and rear, sides of the gate 1160a. The conductivity of the vertical thin body 1110a is controlled in response to the level of charge residing in the vertically oriented portion of the gate 1160a. These channel regions are referred to herein as a "lateral channel regions". The thicknesses $d_1$ of the vertical thin bodies 1110a at the front and/or rear sides of the gate 1160a control the dimensions of the lateral channel regions and therefore affect the operational characteristics of the resulting device. An additional optional channel region 1110b is further provided in the substrate at a position below the gate 1160a. This channel region is referred to herein as a "lower channel region", and the operation of such a channel region is well-studied and documented in the literature. For example, this lower channel region operates much in the same way as a channel region of a recessed channel array transistor (RCAT) type device that includes a trench-style gate electrode, such as that disclosed in U.S. Pat. No. 6,063,669.

Now, referring to FIGS. 22A through 32A, FIGS. 22B through 32B and FIGS. 22C through 32C, a method for fabricating semiconductor devices according to the embodiment of the present invention illustrated in FIGS. 20 and 21A through 21C will be described. FIGS. 22A through 32A are top views of a method for fabrication of the embodiment of FIGS. 20 and 21A through 21C. FIGS. 22B through 32B and FIGS. 22C through 32C are cross-sectional views corresponding to FIGS. 22A through 32A, taken along lines B-B' and C-C' in FIG. 20, respectively.

Figure 22A:
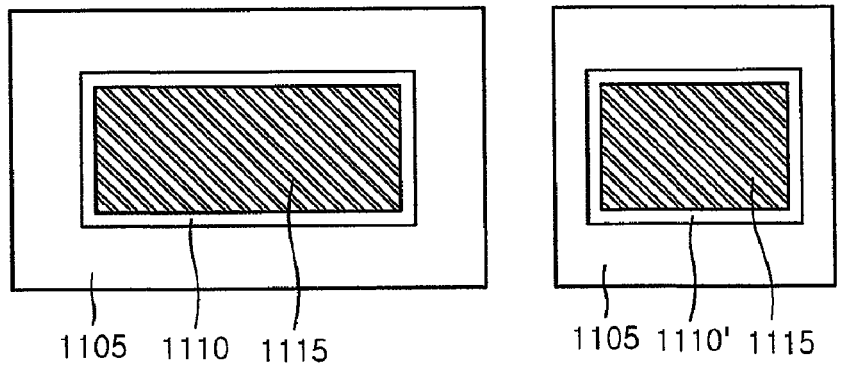
Figure 22B:
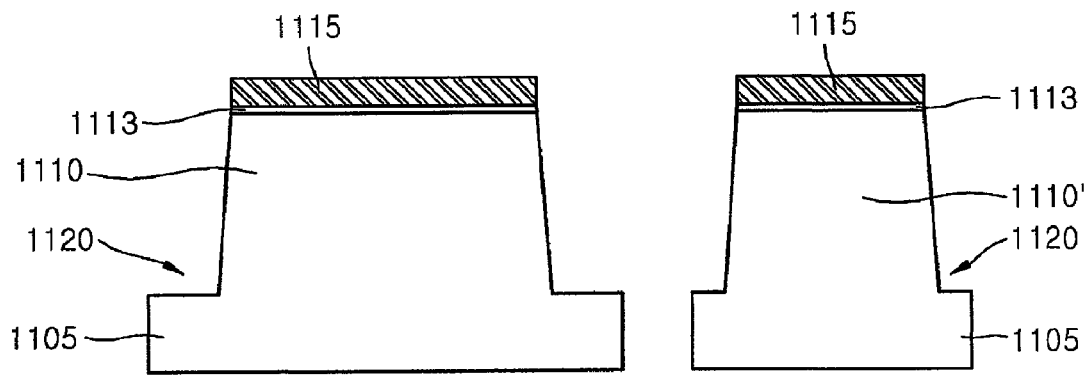
Figure 22C:
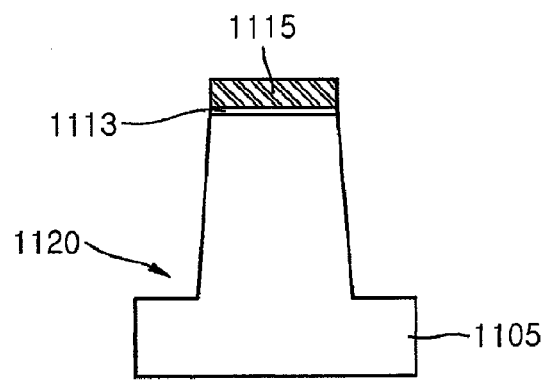

Referring to FIGS. 22A through 22C, a buffer layer is provided on a semiconductor substrate 1105. In one embodiment, the buffer layer comprises a buffer oxide, for example $SiO_2$, formed to a thickness of 100-500 Angstroms using thermal oxidation. A first mask layer is provided on the buffer layer. In one embodiment, the first mask layer comprises a hard mask layer formed of SiN to a thickness of 800-2000 Angstroms using chemical vapor deposition (CVD). The hard mask layer and buffer layer are patterned and etched to form a hard mask layer pattern 1115, a buffer layer pattern 1113, and trenches 1120 that define active regions 1110, 1110' of the semiconductor substrate 1105 in both the cell region and the peripheral region of the device. In one embodiment, the trenches are formed to a depth of 1500-3500 Angstroms. In alternative embodiments, the semiconductor substrate can comprise a semiconductor layer, for example a silicon on insulator (SOI) layer, a silicon germanium layer (SiGe) or a silicon germanium on insulator (SGOI) layer.

Figure 23A:
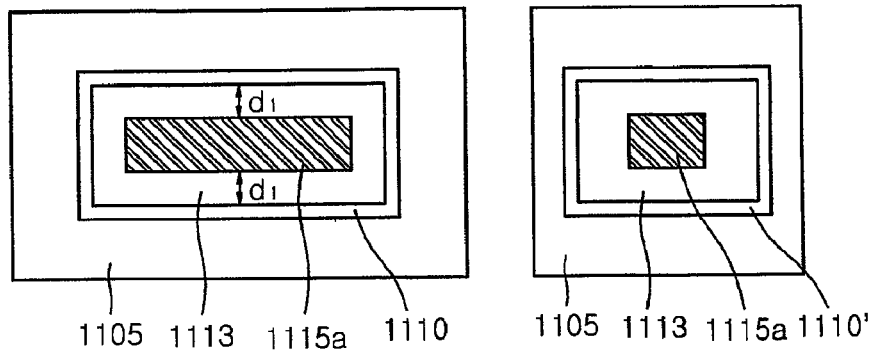
Figure 23B:
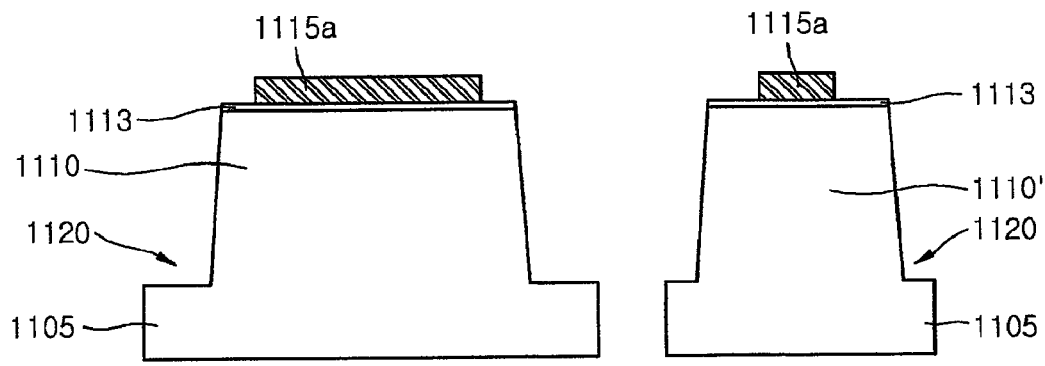
Figure 23C:
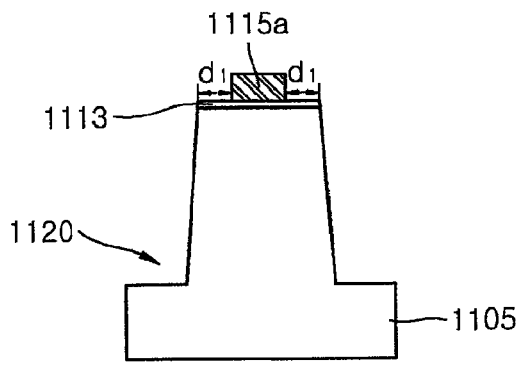

Referring to FIGS. 23A through 23C, a portion of the first mask pattern 1115 is removed in a "pull-back" process to form a second, shrunken, mask pattern 1115a in both cell regions and peripheral regions of the device. In one example, the pull-back process is performed using phosphoric acid $H_3PO_4$, in an isotropic etch procedure or a blanket etch procedure. During the pull-back procedure, the buffer layer pattern 1113 protects the underlying substrate from being etched. In one example, the pull-back operation is performed using an isotropic etch at a low temperature of 60-80 C, for example, 70 C and at a low etch rate. The degree of etch controls the width $d_1$ of the removed portion at front and rear sides of the second mask pattern 1115a (see FIG. 23C). The resulting width $d_1$ directly defines the thickness of the lateral channel regions 1110a of the resulting device, as described above.

Figure 24A:
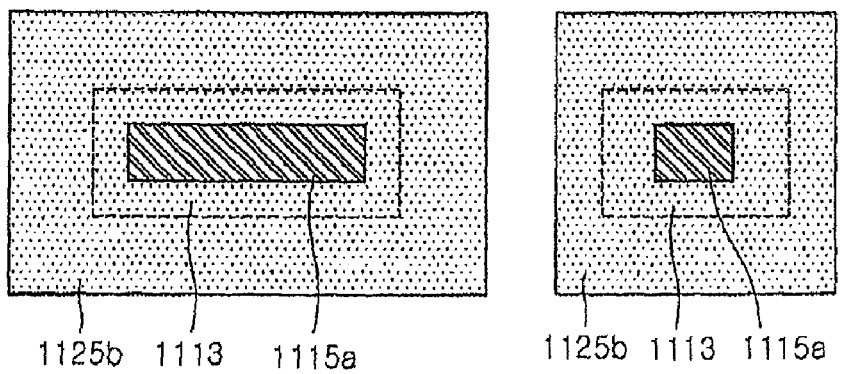
Figure 24B:
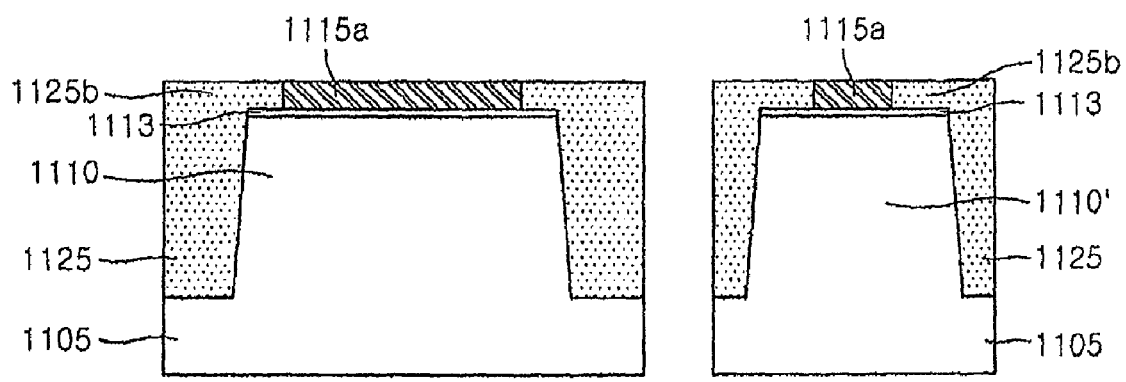
Figure 24C:
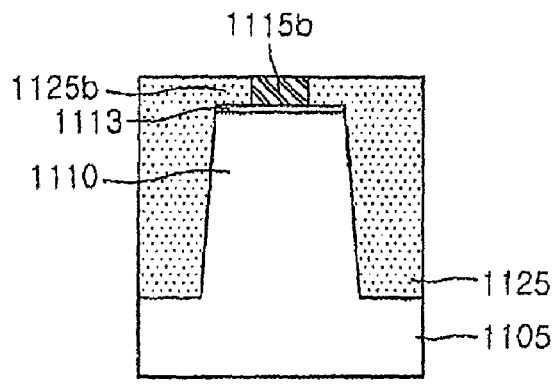

Referring to FIGS. 24A through 24C, a deposition of insulative material is made in both cell regions and peripheral regions of the device to form shallow trench isolation (STI) structures 1125 in the trenches 1120 between the active regions 1110, 1110'. In one example, a deposition of high density plasma (HDP) oxide or $O_3$ TEOS is made to a level above the second mask pattern 1115a. Planarization is then performed on the resulting structure, for example using Chemical-mechanical polishing (CMP) or an etch-back process, using the hard mask of the second mask pattern 1115a as an etch stop layer, so that an upper portion of insulative material 1125b is level with an upper portion of the second mask pattern 1115a.

Figure 25A:
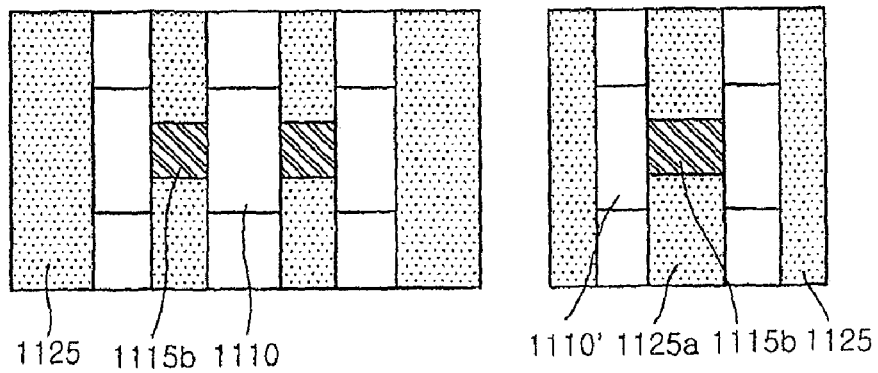
Figure 25B:
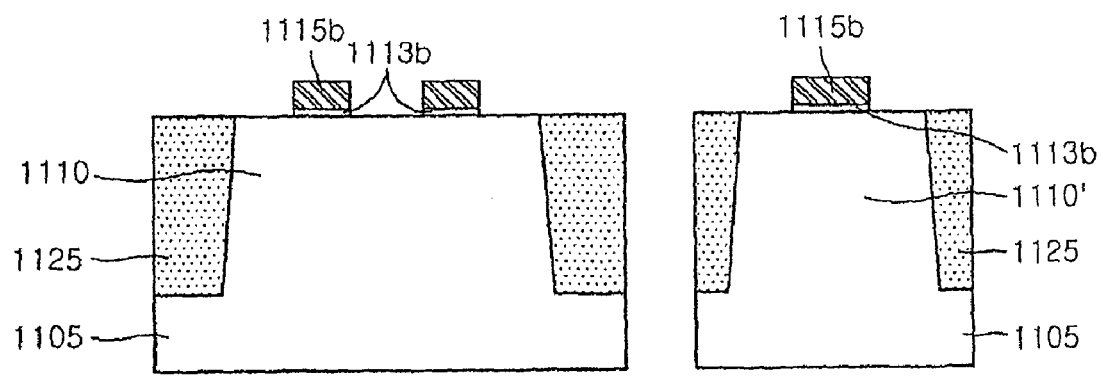
Figure 25C:
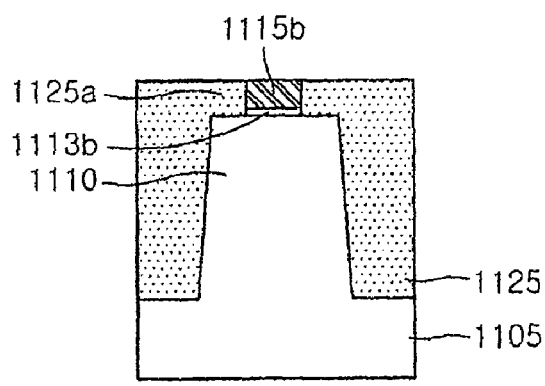

Referring to FIGS. 25A through 25C, the second mask pattern 1115a and insulative material 1125b are etched in the cell region a second time to form a third mask pattern 1115b and a second insulative material pattern 1125a. The underlying buffer layer pattern 1113 is likewise etched to form a second buffer layer pattern 1113b. The etching procedure is performed, in one example, using standard photolithography techniques and a dry etching process. The etch rate is preferably controlled so that the etch rates of the insulative material 1125b and the portions of the hard mask 1115a that are to be removed are about the same. In one embodiment, the etch procedure is performed until a top of the substrate 1105 is exposed, as shown in FIGS. 25A through 25C. However, this approach can result in surface damage to an upper surface of the exposed substrate, in which case a high-temperature treatment of hydrogen gas can be applied to repair the top surface. In another embodiment, the etch procedure is performed to a level of about nearly the bottom of the hard mask pattern 1115b. In this approach, the buffer layer 1113 remains on the substrate to prevent the underlying surface of the substrate from becoming damaged during subsequent layer deposition and removal procedures.

Figure 26A:
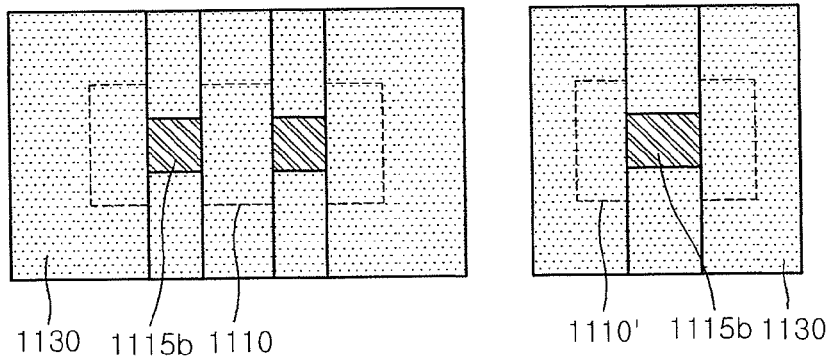
Figure 26B:
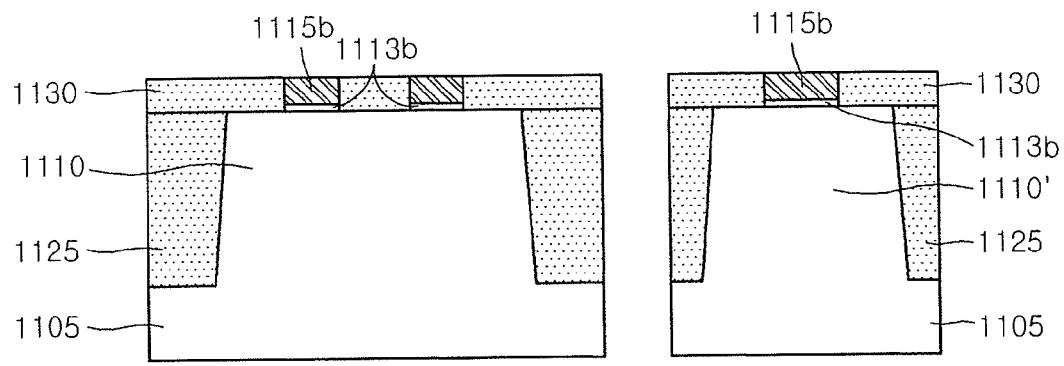
Figure 26C:
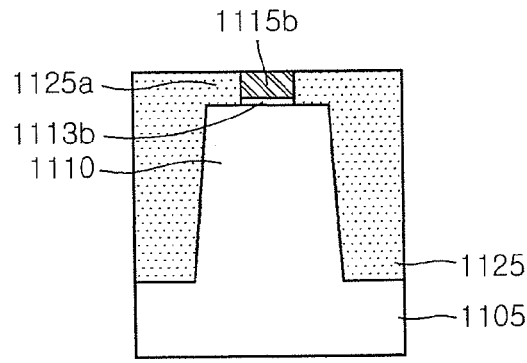

Referring to FIGS. 26A through 26C, a deposition of insulative material is made to coat the resulting structure in both cell regions and peripheral regions of the device. In one example a deposition of high density plasma (HDP) oxide or $O_3$ TEOS is made to a level above the third mask pattern 1115b. Planarization is then performed on the resulting structure, for example using chemical-mechanical polishing (CMP) or an etch-back process, using the hard mask of the third mask pattern 1115b as an etch stop to result in formation of a second insulative material layer 1130, an upper portion of which is level with an upper portion of the third mask pattern 1115b in both cell regions and peripheral regions of the device.

Figure 27A:
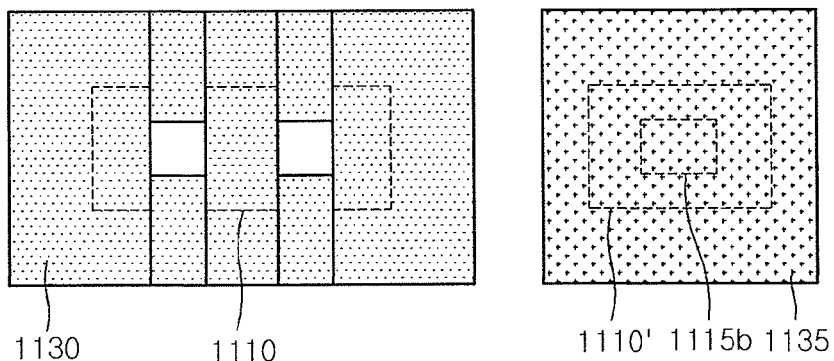
Figure 27B:
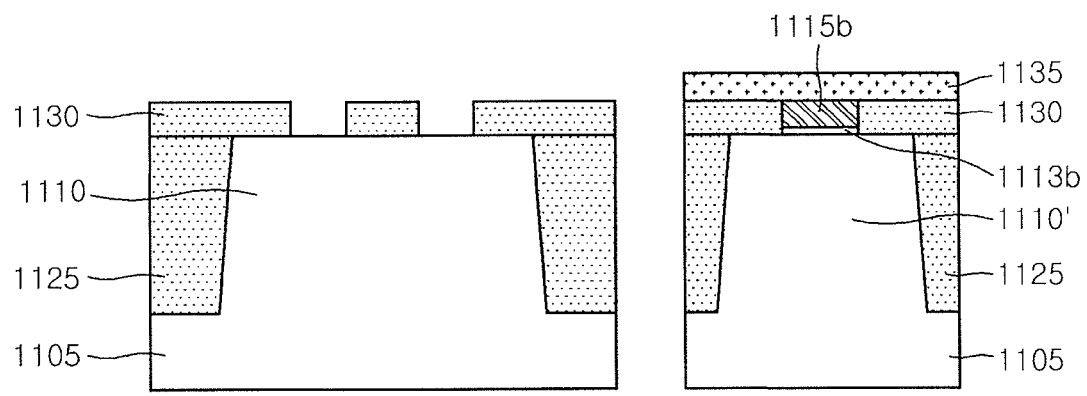
Figure 27C:
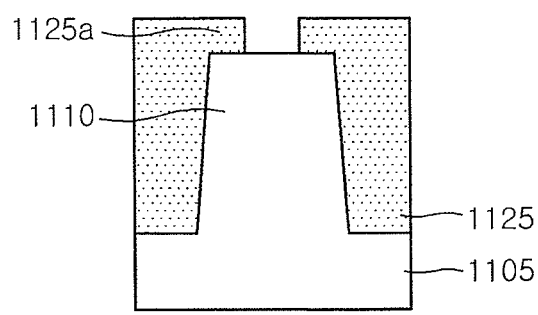

Referring to FIGS. 27A through 27C, a second mask layer 1135 is formed in the peripheral region of the device. The second mask layer 1135 comprises photoresist material or a suitable hard mask material. The third pattern 1115b of the first mask layer and the underlying buffer layer pattern 1113b are next removed in the cell region. In one example, this removal process is performed using phosphoric acid to remove the SiN hard mask pattern 1115b and a hydrofluoric solution to remove the underlying oxide buffer layer pattern 1113b.

Figure 28A:
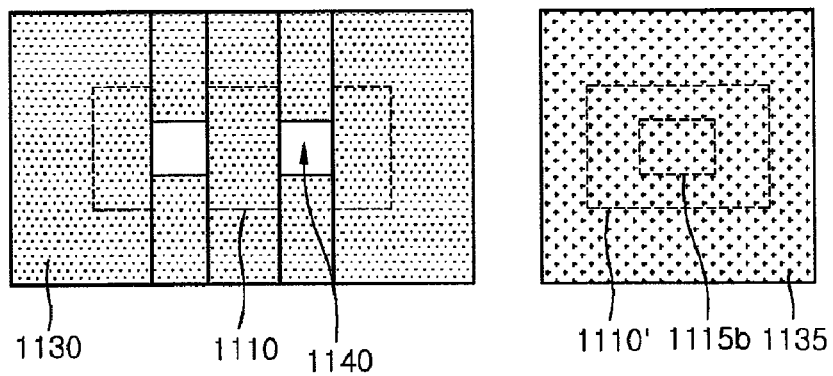
Figure 28B:
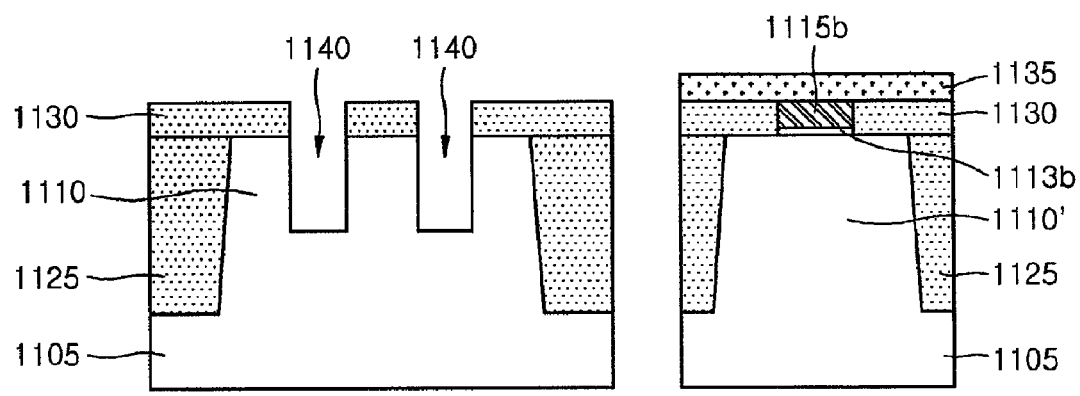
Figure 28C:
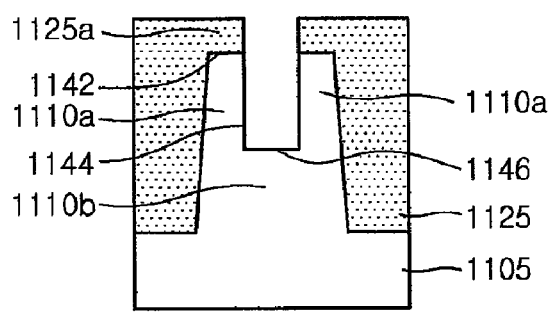

Referring to FIGS. 28A through 28C, the active region 1110 of the cell region is next etched to a predetermined depth, for example to a depth ranging between about 500 and 2000 Angstroms, and preferably ranging between 1000 and 1500 Angstroms. Vertically oriented openings 1140 are thereby formed that have thin-body portions 1110a at front and rear sides that are formed by vertically protruding portions of the substrate 1105. As described above, the thin-body portions 1110a will serve the function of channel regions of the device, the thickness of which is an important parameter in determining the resulting operational characteristics of the device. As described above, the thickness of the thin body portions 1110a is a direct result of the depth $d_1$ of the amount of reduction of the first mask pattern 1115a during the pullback procedure, as shown and described above with reference to FIGS. 23A through 23C. In one example, the maximum thickness of the thin-body portions 1110a is controlled to be less than 400 Angstroms, and preferably, ranging between 30 and 150 Angstroms. By controlling the thickness of the thin-body portions 1110a in this manner, the diffusion of impurities from later-foamed adjacent source and drain regions is minimized, and therefore the short channel effect is mitigated.

Upon formation of the vertically oriented openings 1140, and thin-body portions 1110a, channel region ion implantation is performed in the cell region of the device to faint channel regions in the thin-body portions 1110a and in the region below the lower portion 1110b of the vertically oriented openings 1140.

Figure 29A:
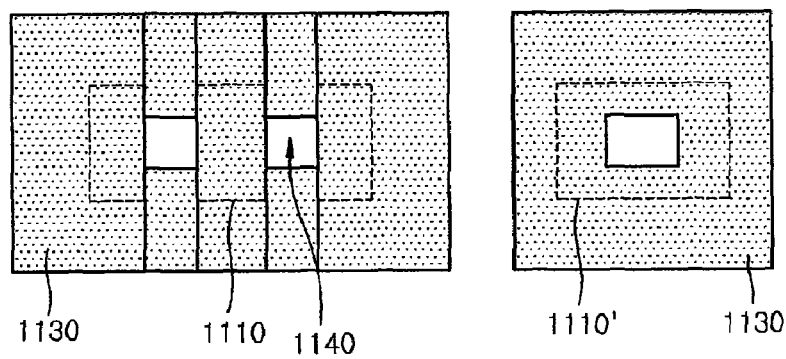
Figure 29B:
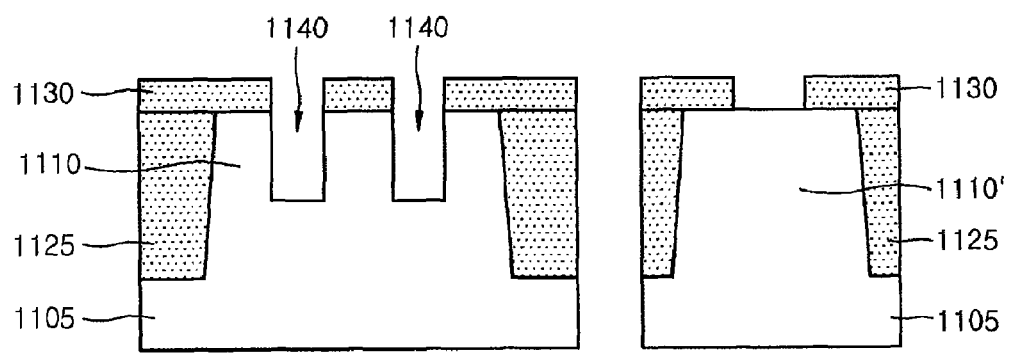
Figure 29C:
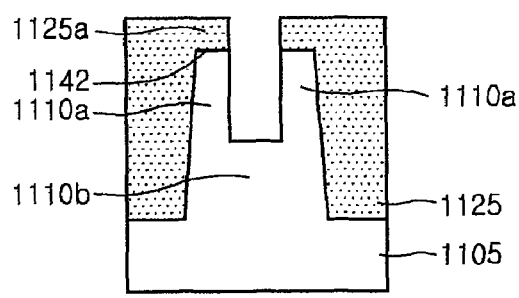
Figure 36A:
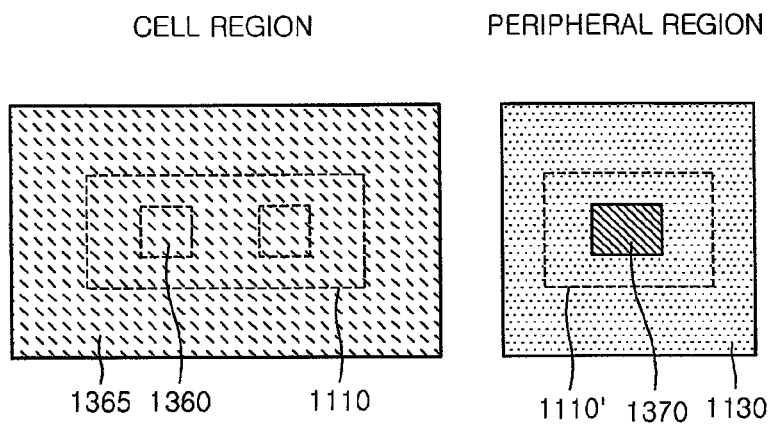
Figure 36B:
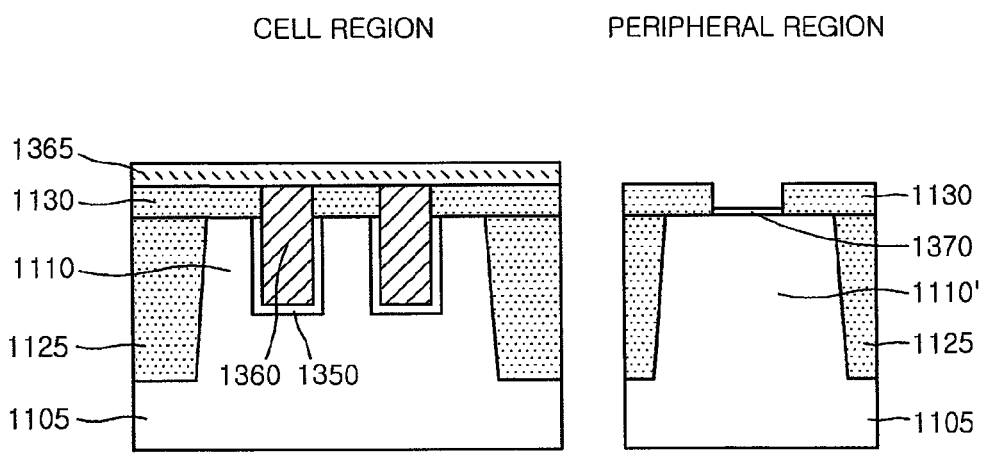
Figure 36C:
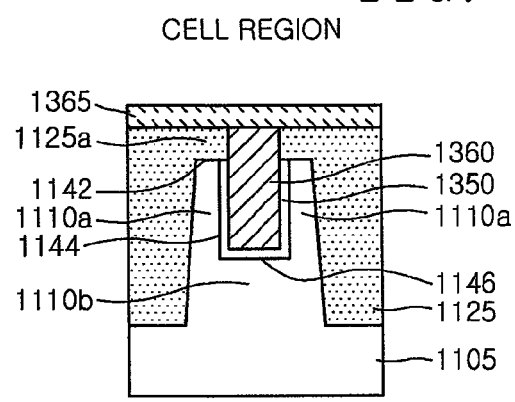

Referring to FIGS. 29A through 29C, the second mask layer 1135 is removed in the peripheral region, and a third mask layer is applied to the cell region. An example of a mask layer applied to the cell region is shown in FIGS. 36A through 36C. In one example, the third mask layer comprises a photoresist layer. The third pattern 1115b of the first mask layer and the underlying buffer layer pattern 1113b are removed in the peripheral region. In one example, this removal process is performed using phosphoric acid to remove the SiN hard mask pattern 1115b and a hydrofluoric solution to remove the underlying oxide buffer layer pattern 1113b. Upon removal of the third mask pattern 1115b and the buffer layer pattern 1113b, channel region ion implantation is performed in the peripheral region of the device.

Figure 30A:
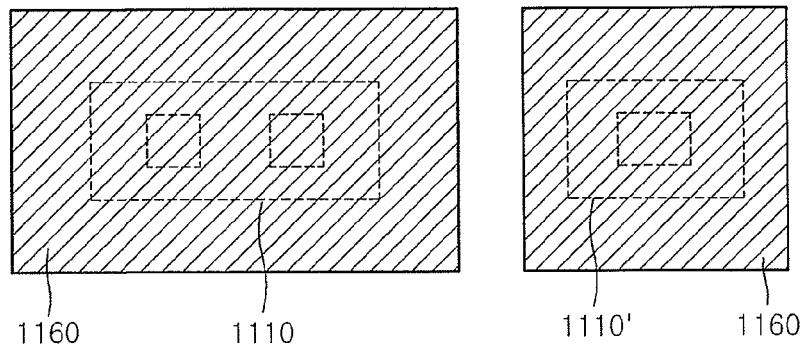
Figure 30B:
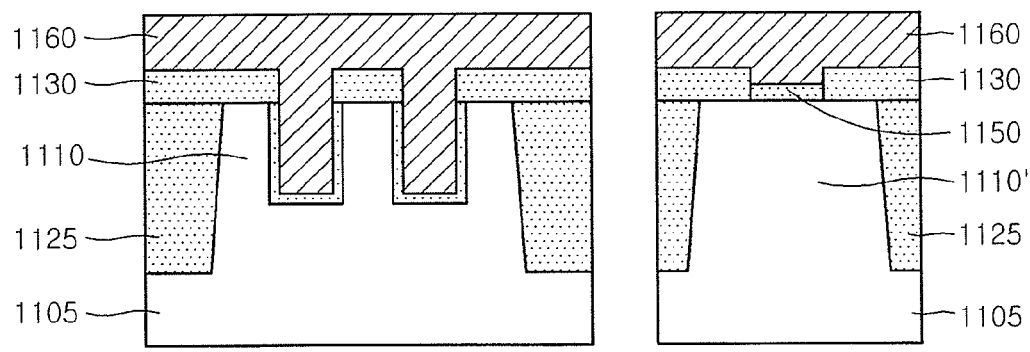
Figure 30C:
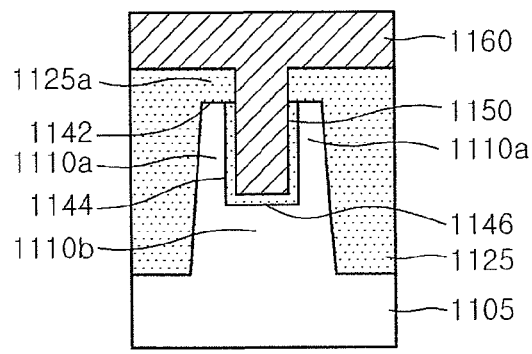

With reference to FIGS. 30A through 30C, a gate dielectric 1150 is next provided in both cell and peripheral regions of the resulting structure. In the cell region, the gate dielectric 1150 comprises a first portion 1146 that is formed on the bottom of the vertically oriented opening 1140 and a second portion 1144 that is formed on sidewalls of the vertically oriented opening 1140. In the peripheral region, the gate dielectric 1150 is formed on an exposed portion of the semiconductor substrate active region 1110'. In one embodiment, the gate dielectric 1150 is formed in a selective growth process, on exposed portions of the semiconductor substrate, as shown in FIGS. 30A through 30C. In another embodiment, the gate dielectric is formed using atomic layer deposition as a layer that covers the entire resulting structure of the semiconductor device.

A gate electrode material layer 1160 is next provided on the resulting structure. The gate electrode material layer 1160 fills the vertically oriented openings 1140 in the cell region, and the opening in the insulative layer 1130 in the peripheral region. The gate electrode material layer comprises, for example, polysilicon, W, Pt, TiN, Ta, TaN, Cr, a combination or alloy thereof, or other suitable material.

Figure 31A:
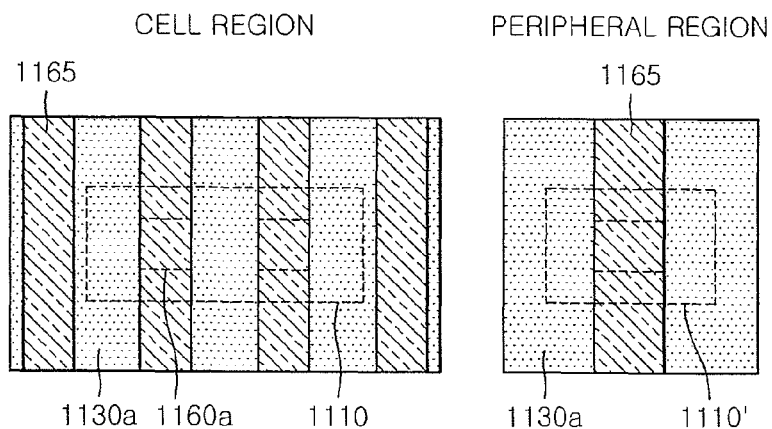
Figure 31B:
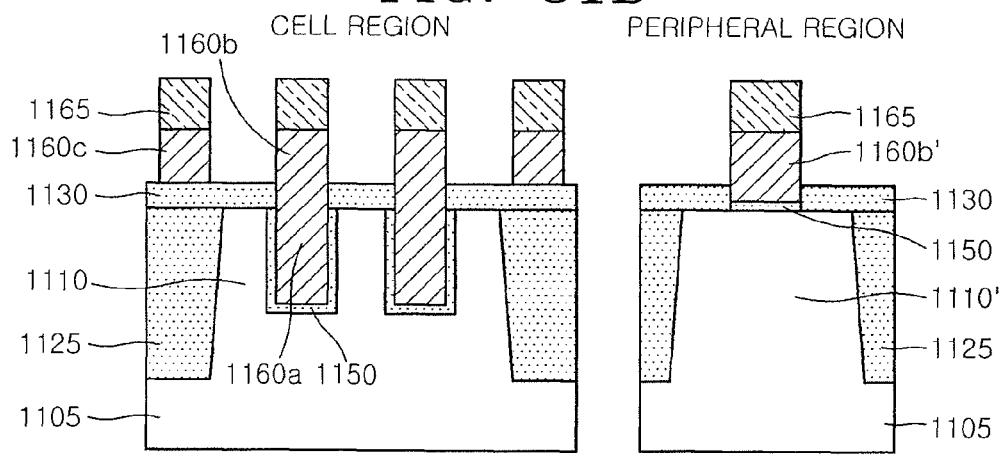
Figure 31C:
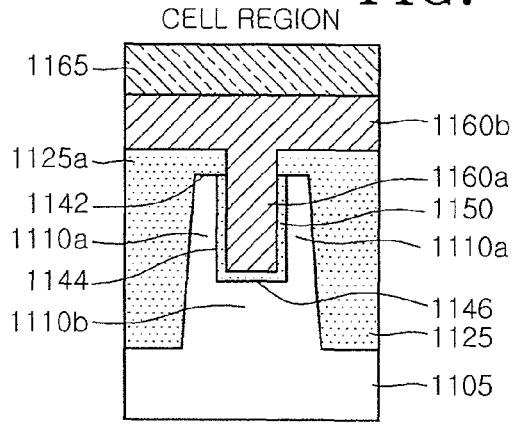

With reference to FIGS. 31A through 31C, the gate electrode material layer 1160 is next patterned to form laterally oriented portions 1160b of the gate electrodes in the cell regions, the laterally oriented gate electrodes 1160b' in the peripheral regions, and other conductive lines 1160c that form interconnects for the device. In one embodiment, patterning is performed by applying a SiN layer pattern 1165 on the gate electrode material layer 1160, and etching the gate electrode material layer 1160 using the SiN pattern as an etching mask.

Figure 32A:
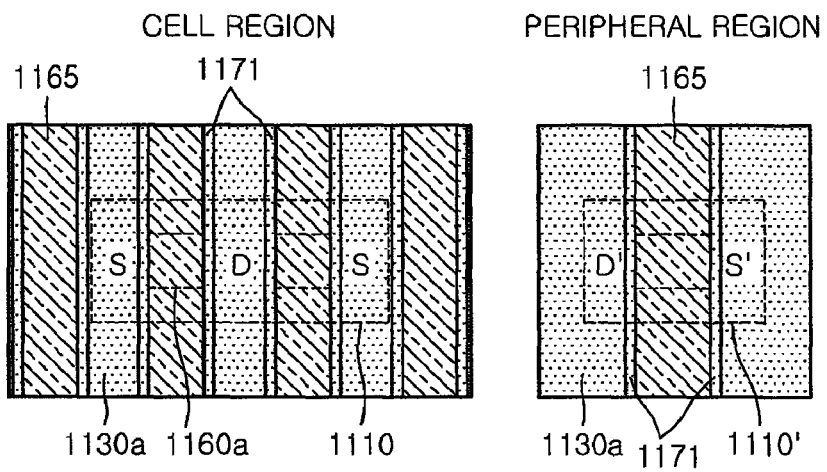
Figure 32B:
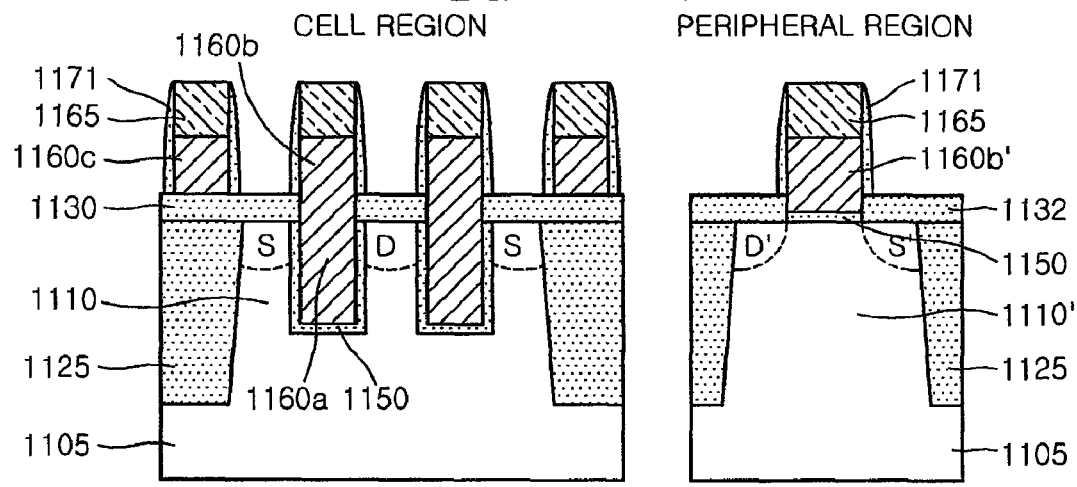
Figure 32C:
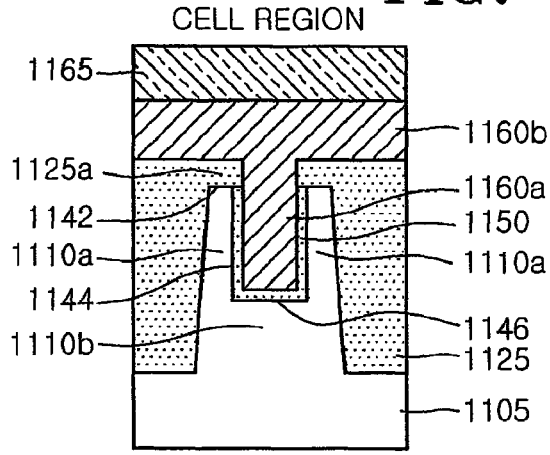

With reference to FIGS. 32A through 32C, sidewall spacers 1171 are formed on the resulting structure by providing a dielectric layer on the resulting structure, and performing an anisotropic etch to form the spacers 1171. An ion implantation process is performed before or after formation of the spacers to form source and drain regions S, D using the gate electrodes 1160b, 1160b', and conductive lines 1160c, and associated SiN layer pattern 1165, as an etch mask. In particular, during ion implantation, the presence of the lateral portions 1160b of the gate electrodes prevents the thin body regions 1110a from becoming implanted or doped. The source/drain regions are preferably formed to a depth ranging between about 400 and 800 Angstroms, to a depth less than the depth of the vertically oriented opening, in order to mitigate or prevent the short channel effect.

The method described above in connection FIGS. 22 through 32 results in a semiconductor device configuration as shown and described in FIGS. 20 and 21 above. In particular, the semiconductor device according to this embodiment of the present invention includes vertically oriented thin-body transistors 1096 formed in a first region, for example a cell region, of the device, and conventional planar-type transistors 1098 formed in a second region, for example, a peripheral region, of the device. In this manner, the advantageous characteristics of each type of transistor can be applied to a region of the transistor where they are most applicable.

Figure 33:
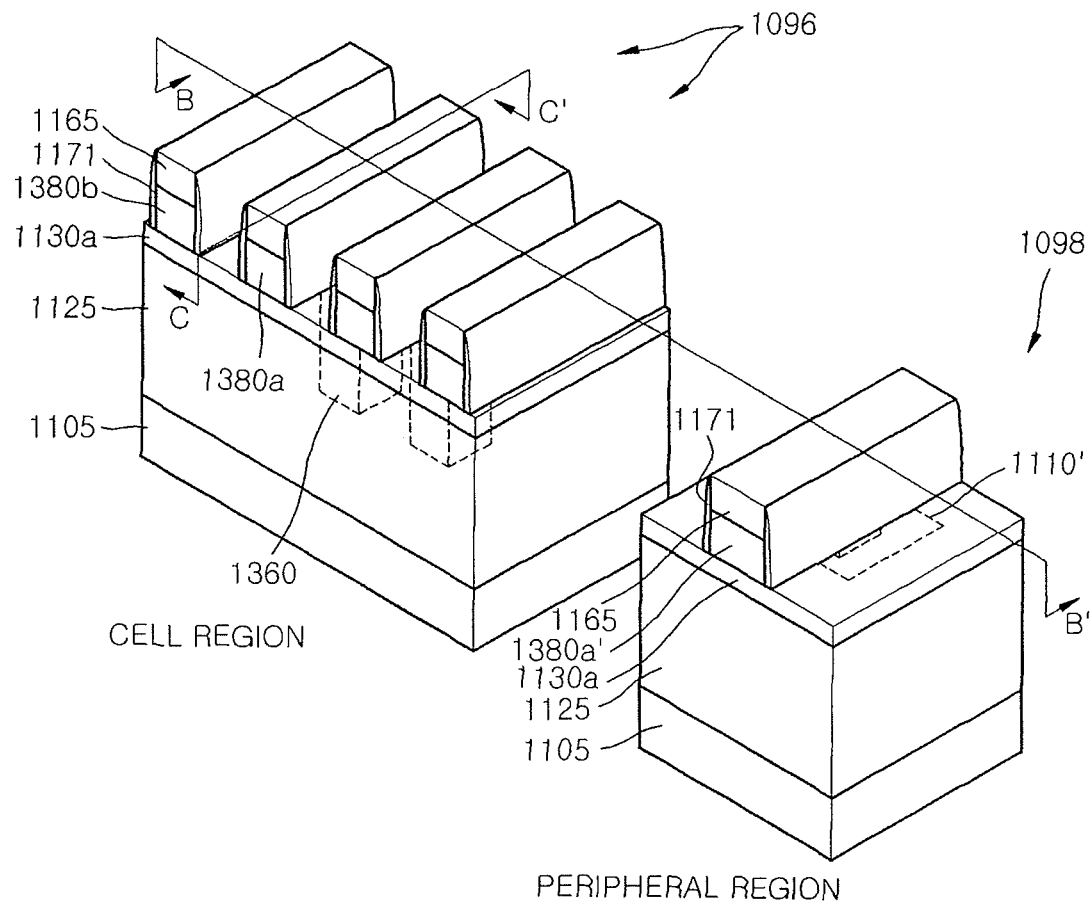
FIG. 33 is a perspective view of another embodiment of a semiconductor device in accordance with the present invention.
Figure 34A:
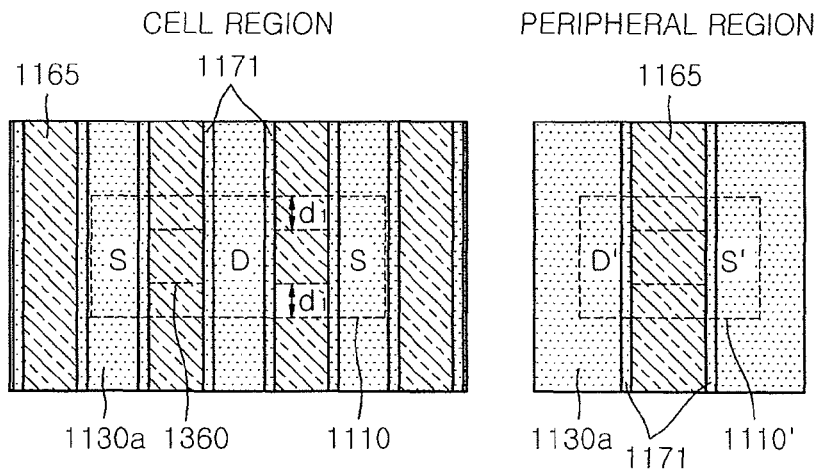
FIG. 34A is a top view of the semiconductor device of FIG. 33.
Figure 34B:
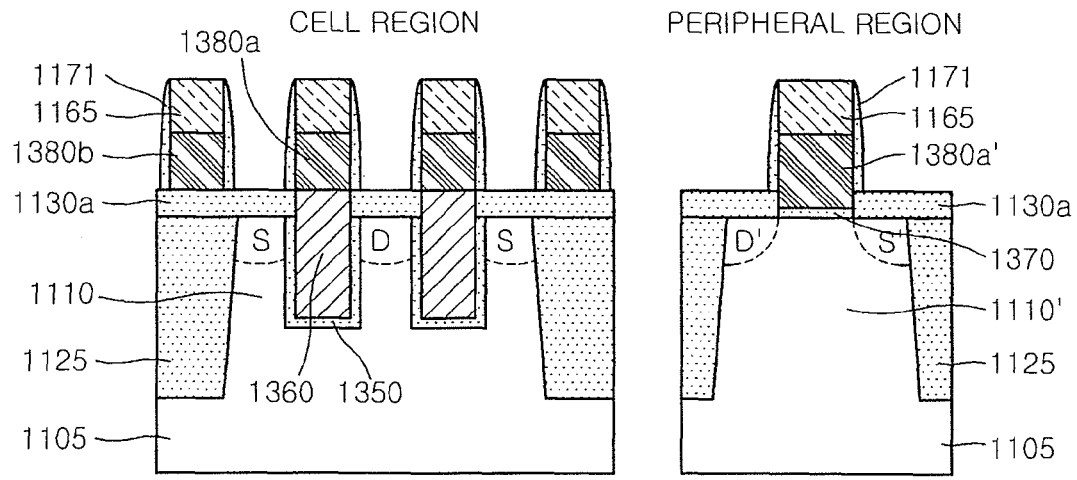
FIG. 34B is a cross-sectional view of the semiconductor device of FIG. 33 taken along line B-B' in FIG. 33.

FIG. 33 is a perspective view of another embodiment of a semiconductor device in accordance with the present invention. FIG. 34A is a top view of the semiconductor device of FIG. 33. FIG. 34B is a cross-sectional view of the semiconductor device of FIG. 33 taken along line B-B' in FIG. 33.

Figure 34C:
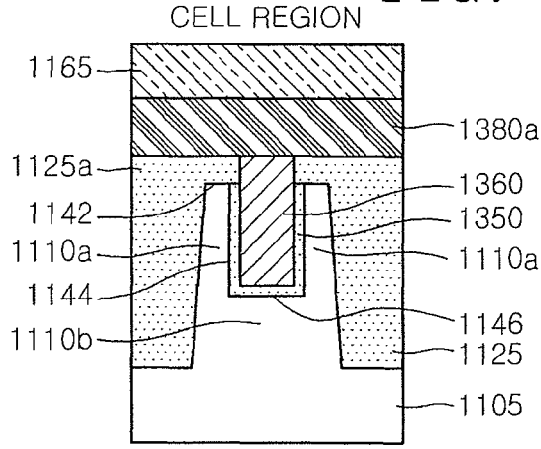
FIG. 34C is a cross-sectional view of the semiconductor device of FIG. 33 taken along line C-C' in FIG. 33.

FIG. 34C is a cross-sectional view of the semiconductor device of FIG. 33 taken along line C-C' in FIG. 33.

With reference to FIGS. 33 and 34A-34C, the semiconductor device according to this embodiment of the present invention includes vertically oriented thin body transistors 1096 formed in a first region of the device, and conventional planar-type transistors 1098 formed in a second region of the device. In one embodiment, the semiconductor device comprises a memory device, the first region comprises a cell region of the memory device and the second region comprises a peripheral region of the memory device.

The present embodiment is substantially similar in structure to that of the above embodiment of FIGS. 20 and 21 and the method of formation thereof is substantially similar to that of the embodiment of FIGS. 22 through 32 above. For this reason, a detailed discussion of similar portions of the embodiment and method of formation thereof will not be repeated here. In the present embodiment, however, the vertically oriented gate portions 1360 and laterally oriented gate portions 1380a are not formed as a single, unitary, layer, as shown in FIG. 21C (vertical portion 1160a and lateral portion 1160b are unitary in FIG. 21C), but rather are formed as independent portions, for example, as vertically oriented portion 1360 and laterally oriented portion 1380a, at different times, and of different materials, for the reasons described below.

Now, referring to FIGS. 35A through 38A, FIGS. 35B through 38B and FIGS. 35C through 38C, a method for fabricating semiconductor devices according to the embodiment of the present invention illustrated in FIGS. 33 and 34A through 34C will be described. FIGS. 35A through 38A are top views of a method for fabrication of the embodiment of FIGS. 33 and 34A through 34C. FIGS. 35B through 38B and FIGS. 35C through 38C are cross-sectional views corresponding to FIGS. 35A through 38A, taken along lines B-B' and C-C' in FIG. 33, respectively.

The initial steps in the process for forming a semiconductor device in accordance with the present embodiment of the invention is substantially similar to those steps illustrated above with reference to FIGS. 22 through 28. For this reason, a detailed discussion of such steps will not be repeated here.

Figure 35A:
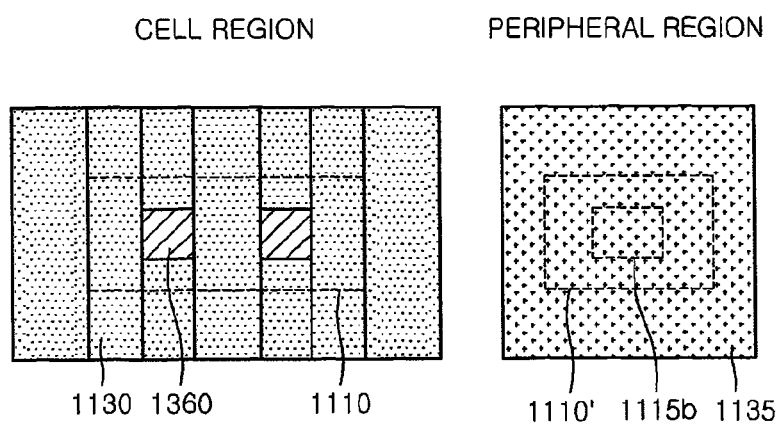
Figure 35B:
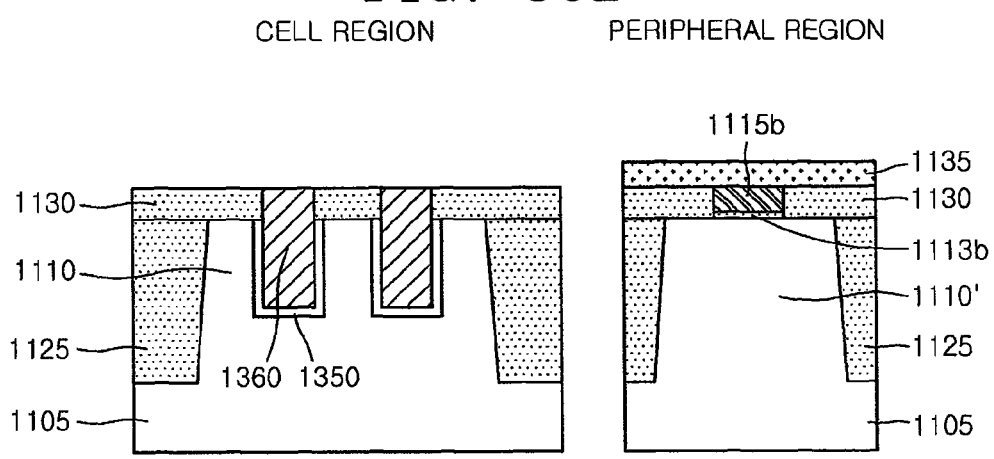
Figure 35C:
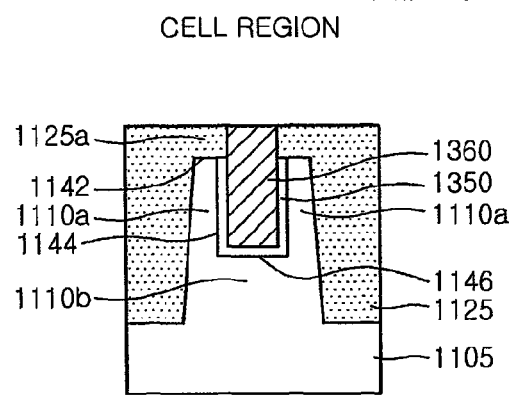

Referring to FIGS. 35A through 35C, in this embodiment, the second mask layer 1135 remains in the peripheral region at this step. A gate dielectric 1350 is next provided in the cell region of the resulting structure. In the cell region, the gate dielectric 1350 comprises a first portion 1146 that is formed on the bottom of the vertically oriented openings 1140 and a second portion 1144 that is formed on sidewalls of the vertically oriented openings 1140. The gate dielectric can be formed using a selective growth process or as a layer on the resulting structure, as described above.

A first application of a gate electrode material layer is next provided on the resulting structure. The first application of the gate electrode material layer fills the vertically oriented openings 1140 in the cell region to form a vertically oriented gate portion 1360 of the vertical gate. The first gate electrode material layer 1360 comprises, for example, polysilicon, W, Pt, TiN, Ta, TaN, Cr, a combination or alloy thereof, or other suitable material, as described above. An etch procedure is applied to the first gate electrode material layer using the second insulative material layer 1130 as an etch stop.

With reference to FIGS. 36A through 36C, the second mask layer 1135 in the peripheral region is removed and a third mask layer 1365 is applied in the cell region. The third mask layer 1365 comprises, for example, an appropriate photoresist material or other suitable hard mask material. The third pattern 1115b of the first mask layer and the underlying buffer layer pattern 1113b are then removed in the peripheral region, in the manner described above. Ion implantation of the channel region is performed in the manner described above.

A second gate dielectric 1370 is next provided on the exposed upper surface of the active region 1110' in the peripheral region of the resulting structure. The second gate dielectric 1370 is formed for example, using a radical growth process. Other processes for forming the second gate dielectric 1370 are equally applicable to the present invention. The second gate dielectric 1370 can be formed of a different material, to a different thickness, using a different process, than those of the first gate dielectric 1350 of the cell region. As a result, the characteristics of the transistors in the peripheral region and those in the cell region can be tailored to their specific needs.

Figure 37A:
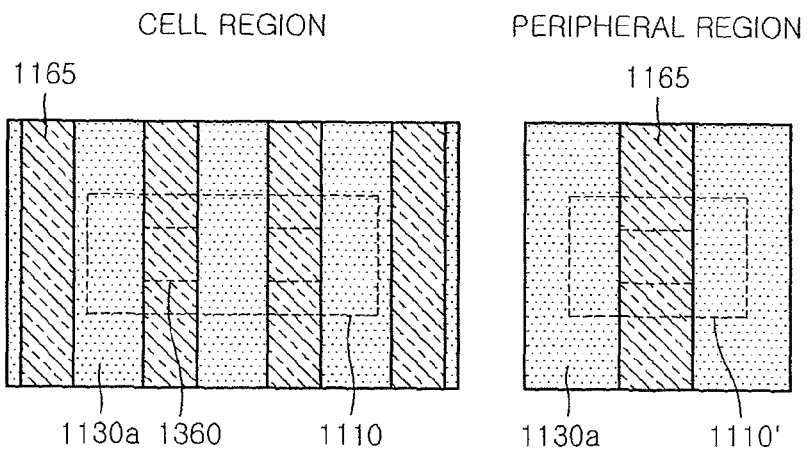
Figure 37B:
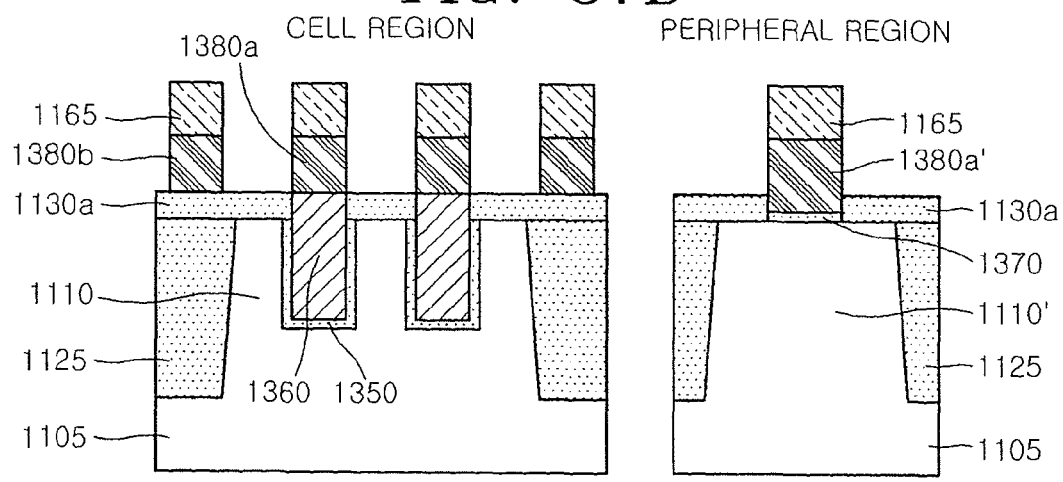
Figure 37C:
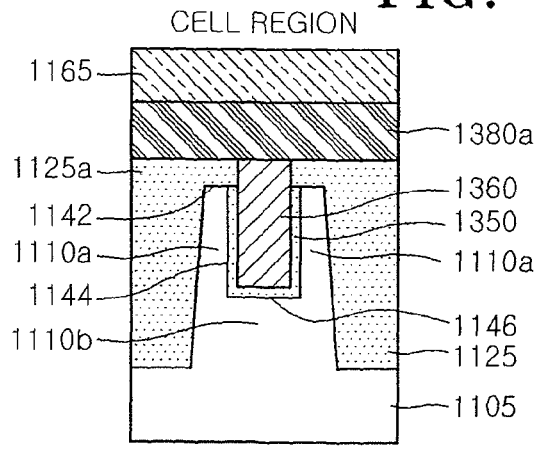

With reference to FIGS. 37A through 37C, the third mask layer 1365 in the cell region is removed and a second gate electrode material layer is applied to the resulting structure. The second electrode material layer is patterned to form the laterally oriented second portions 1380a of the vertical gates 1360 of the thin-body transistors in the cell region. Also formed at the same time are conductive lines 1380b and gate 1380a' of the planar transistor in the peripheral region. In one embodiment, patterning is performed by applying a SiN layer pattern 1165 on the second gate electrode material layer 1380, and etching the gate electrode material layer 1380 using the SiN pattern as an etching mask.

Figure 38A:
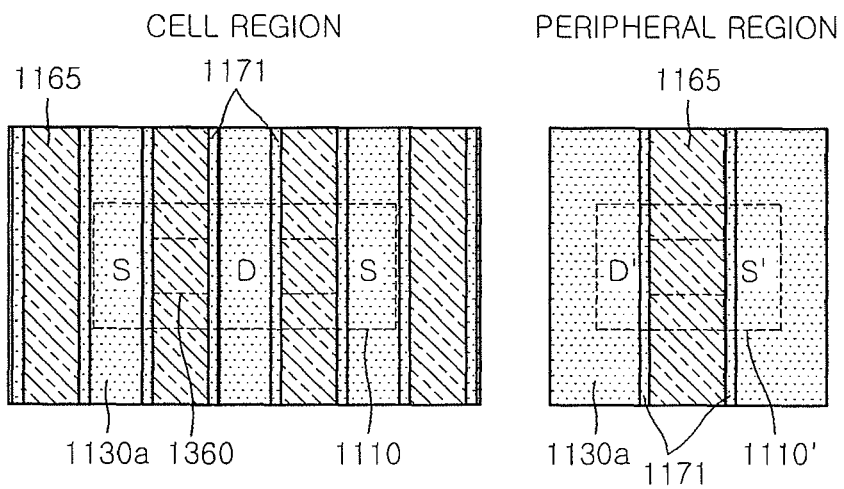
Figure 38B:
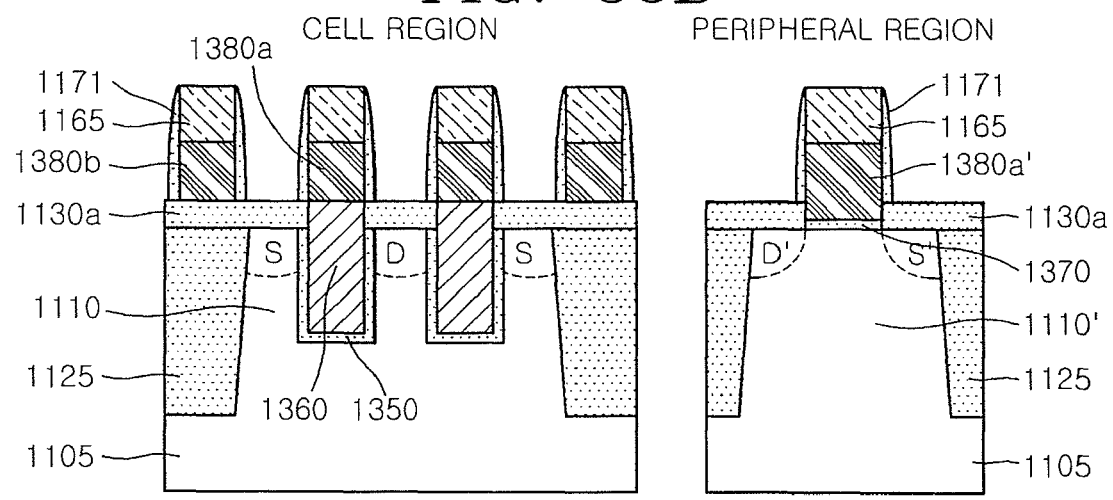
Figure 38C:
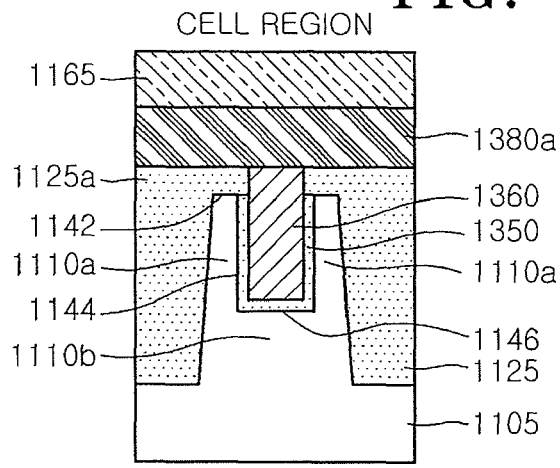

With reference to FIGS. 38A through 38C, sidewall spacers 1171 are formed on the resulting structure by providing a dielectric layer on the resulting structure, and performing an anisotropic etch to form the spacers 1171. An ion implantation process is performed before or after formation of the spacers 1171 to form source and drain regions S, D using the gate electrodes 1160b, 1160b', and conductive lines 1160c as an etch mask.

The method described above in connection FIGS. 35 through 38 results in a semiconductor device configuration as described in FIGS. 33 and 34 above. In particular, this embodiment of the present invention provides vertically oriented thin-body transistors 1096 in the cell region that have multiple layer electrodes and conventional planar transistors 1098 in the peripheral region that have single layer electrodes. For example, in one embodiment, the first conductive material layer 1360 comprises metal and the second conductive metal layer 1380 comprises polysilicon. In another embodiment, the first conductive material layer 1360 comprises polysilicon and the second conductive material layer 1380 comprises metal. In another embodiment, the first conductive material layer 1360 comprises metal of a first type and the second conductive material layer 1380 comprises metal of a second type.

The work function of the gate material is known to have a direct effect on the threshold voltage of the resulting transistor. Therefore, a gate material of the vertical gate 1360 of the thin body transistors 1196 is selected that results in increased threshold voltage with low channel dopant concentration. In particular, in DRAM and SRAM devices, the desired threshold voltage of a cell region transistor is different than that of a peripheral region transistor. To achieve such a higher threshold voltage, the dopant concentration of the channel region can be increased. However, it is very difficult to precisely control the resulting threshold voltage of the transistor using impurity concentration, and this approach also results in degradation of the Q performance of the transistor, due to impurity scattering in the channel region.

In addition, this embodiment of the present invention gate dielectric 1370 of the planar transistors in the peripheral region can be formed of a different material, to a different thickness, using a different process, than those of the gate dielectric 1350 of the vertically oriented thin body transistors of the cell region. As a result, the characteristics of the transistors in the peripheral region and those in the cell region can be tailored to their specific needs.

For example, in one example, the semiconductor device is a DRAM memory device and the threshold voltage of the vertically oriented thin-body transistors is about 0.7 volts and the threshold voltage of the planar transistors is in a range of about 0.3 volts to 0.7 volts. In another example, the semiconductor device is an SRAM memory device and the threshold voltage of the vertically oriented thin-body transistors is about 0.5 volts and the threshold voltage of the planar transistors is about 0.7 volts.

Figure 39:
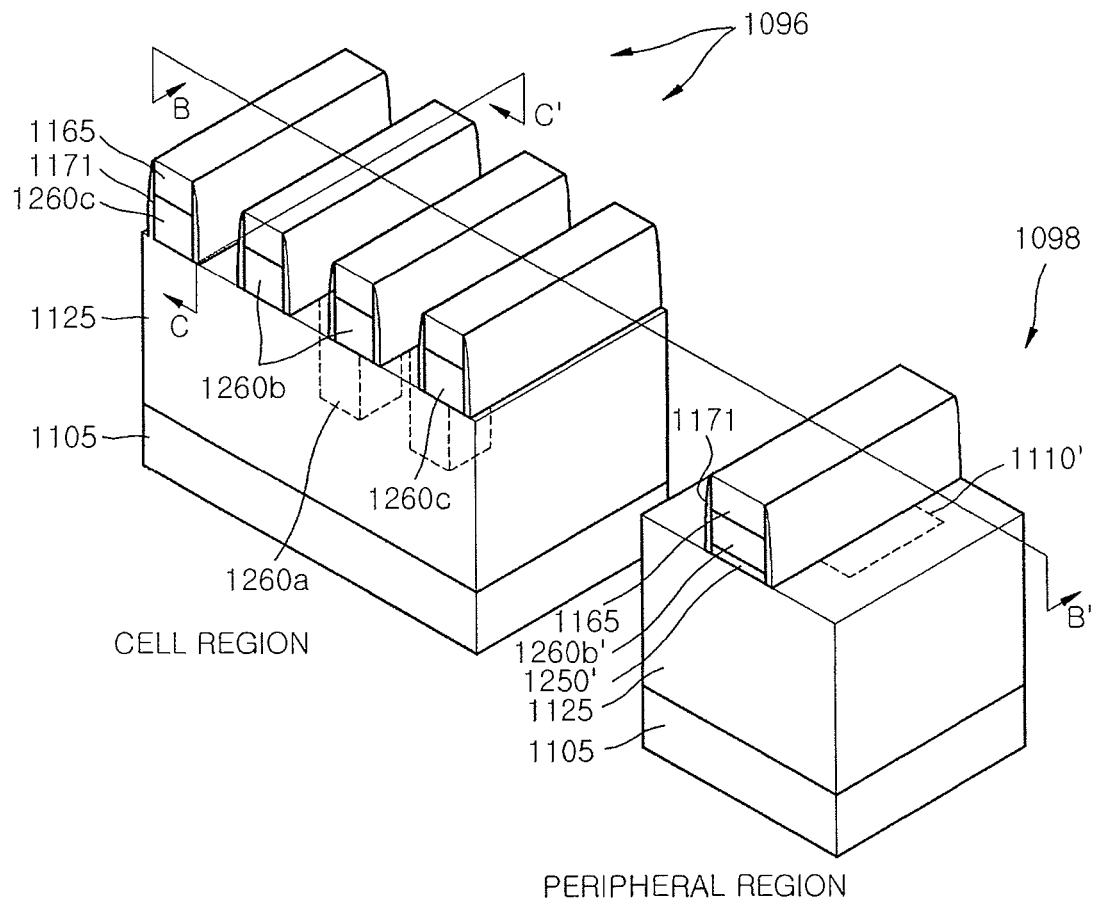
FIG. 39 is a perspective view of another embodiment of a semiconductor device in accordance with the present invention.
Figure 40A:
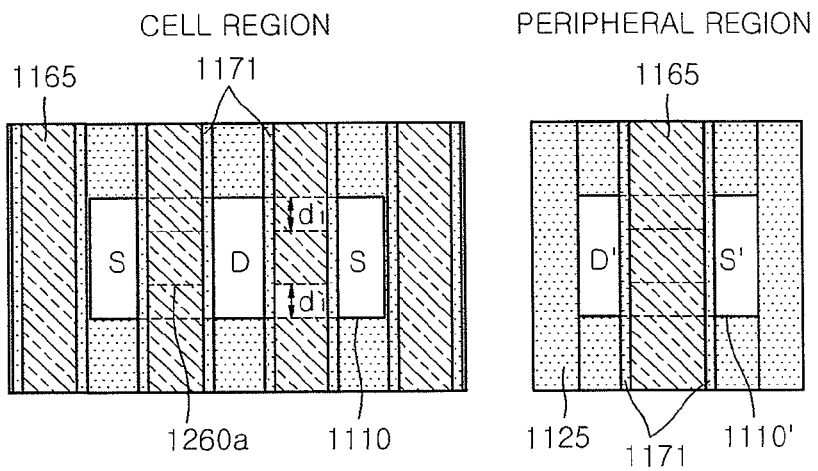
FIG. 40A is a top view of the semiconductor device of FIG. 39.
Figure 40B:
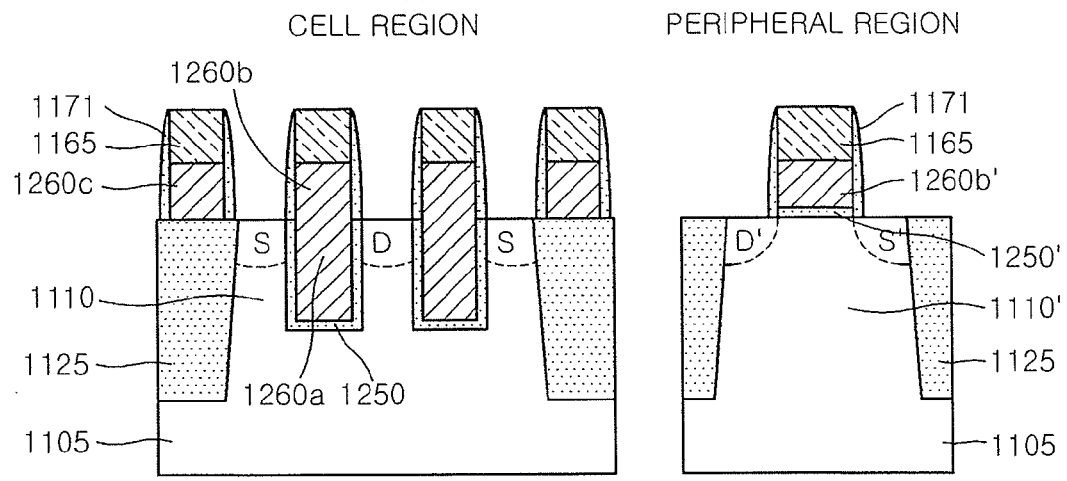
FIG. 40B is a cross-sectional view of the semiconductor device of FIG. 39 taken along line B-B' in FIG. 39.
Figure 40C:
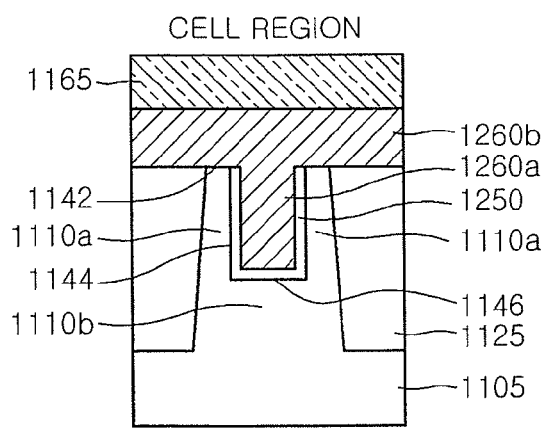
FIG. 40C is a cross-sectional view of the semiconductor device of FIG. 39 taken along line C-C' in FIG. 39.

FIG. 39 is a perspective view of another embodiment of a semiconductor device in accordance with the present invention. FIG. 40A is a top view of the semiconductor device of FIG. 39. FIG. 40B is a cross-sectional view of the semiconductor device of FIG. 39 taken along line B-B' in FIG. 39. FIG. 40C is a cross-sectional view of the semiconductor device of FIG. 39 taken along line C-C' in FIG. 39.

With reference to FIG. 40B, the semiconductor device according to this embodiment of the present invention includes a gate dielectric 1250, 1250' that is deposited as a layer, or grown on exposed surfaces of the substrate, in both the cell region and peripheral region of the device at the same time. This embodiment eliminates the need for formation of the second insulative material layer 1130 on the substrate surface, as described above with reference to FIGS. 26A through 26C.

The present embodiment is substantially similar in structure to that of the above embodiment of FIGS. 20 and 21, and 33 and 34 and the method of formation thereof is substantially similar to that of the embodiment of FIGS. 22 through 32 and FIGS. 35 through 38 above. For this reason, a detailed discussion of similar portions of the embodiment and method of formation thereof will not be repeated here.

Now, referring to FIGS. 41A through 43A, FIGS. 41B through 43B and FIGS. 41C through 43C, a method for fabricating semiconductor devices according to the embodiment of the present invention illustrated in FIGS. 39 and 40A through 40C will be described. FIGS. 41A through 43A are top views of a method for fabrication of the embodiment of FIGS. 39 and 40A through 40C. FIGS. 41B through 43B and FIGS. 41C through 43C are cross-sectional views corresponding to FIGS. 41A through 43A, taken along lines B-B' and C-C' in FIG. 39 respectively.

Figure 41A:
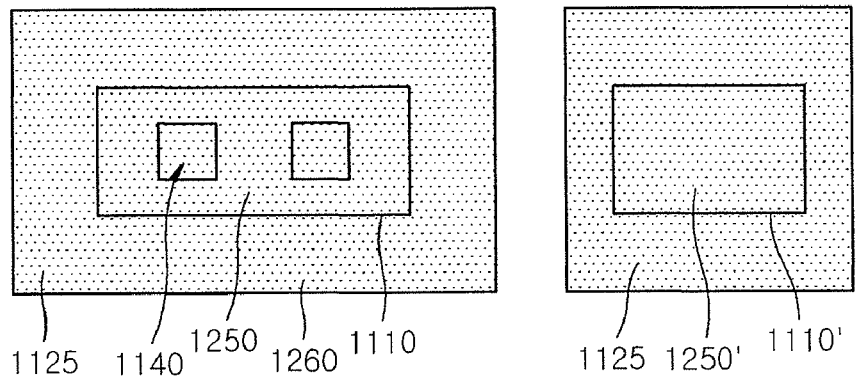
Figure 41B:
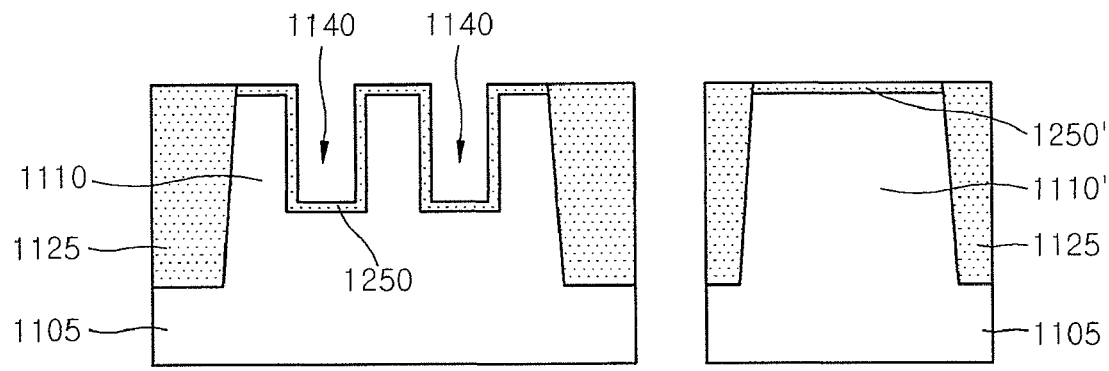
Figure 41C:
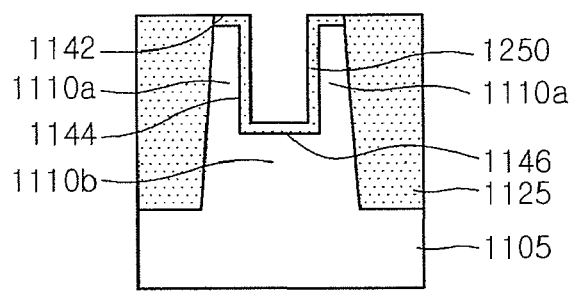

Referring to FIGS. 41A through 41C, in this embodiment, a gate dielectric 1250, 1250' is provided in both the cell and peripheral regions. In the cell region, the gate dielectric 1250 comprises a first portion 1146 that is formed on the bottom of the vertically oriented openings 1140, a second portion 1144 that is formed on sidewalls of the vertically oriented openings 1140, and a third portion 1142 that is formed on an upper surface of the exposed semiconductor substrate active region 1110. The gate dielectric 1250' is further formed in the peripheral region. The gate dielectric can be formed using a selective growth process or as a layer on the resulting structure, as described above.

Figure 42A:
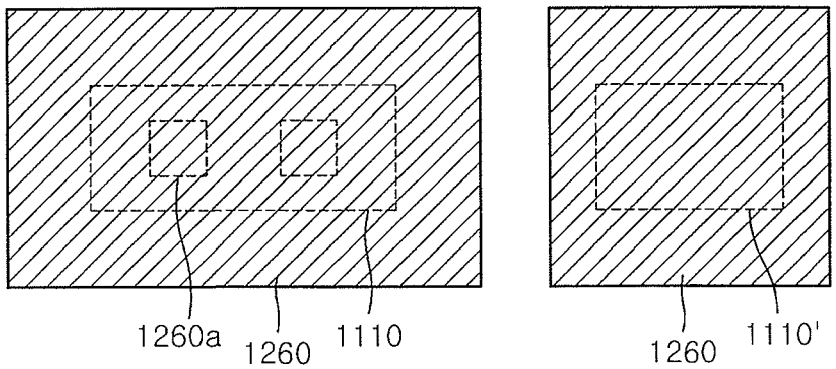
Figure 42B:
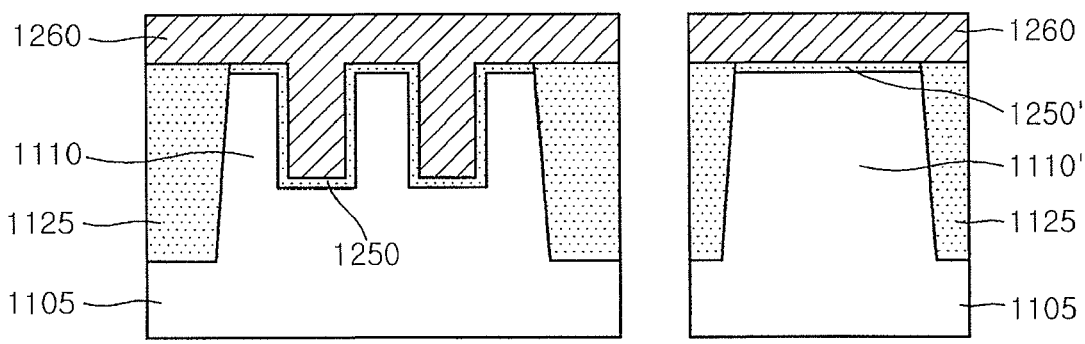
Figure 42C:
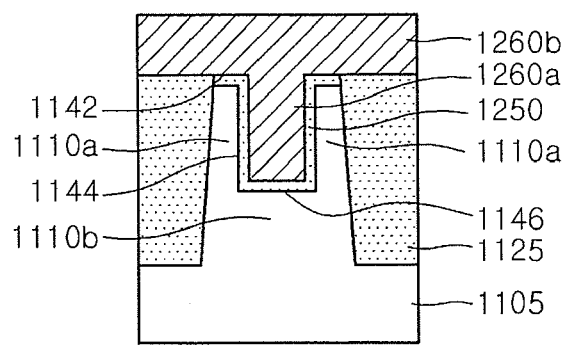

With reference to FIGS. 42A through 42C, a gate electrode material layer 1260 is next provided on the resulting structure. Vertical portion 1260a of the gate electrode material layer 1260 fills the vertically oriented openings 1140 in the cell region. The gate electrode material layer 1260 comprises, for example, polysilicon, W, Pt, TiN, Ta, TaN, Cr, a combination or alloy thereof, or other suitable material, as described above.

Figure 43A:
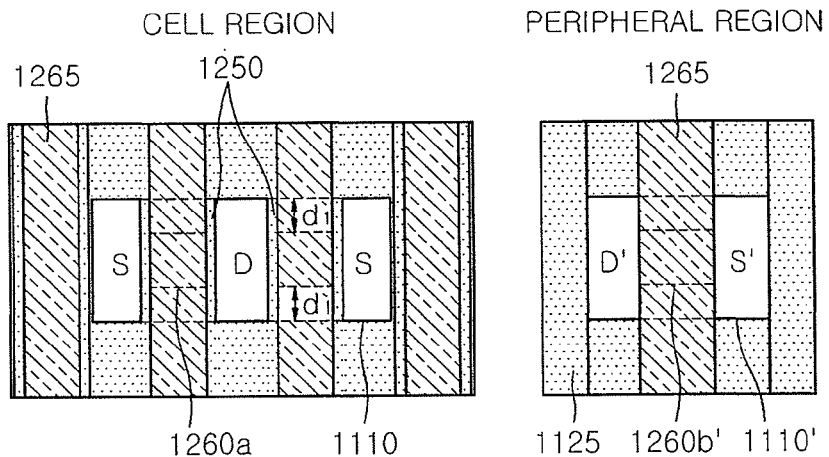
Figure 43B:
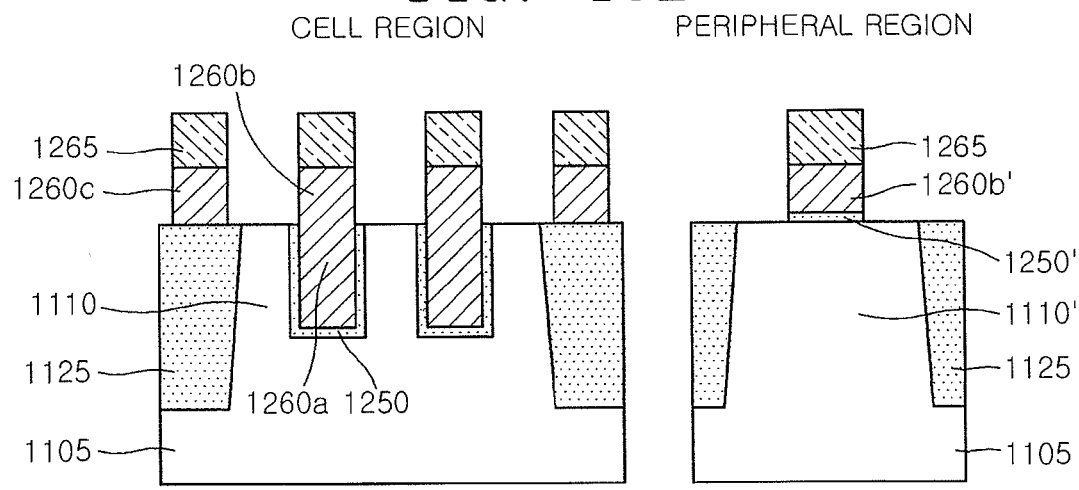
Figure 43C:
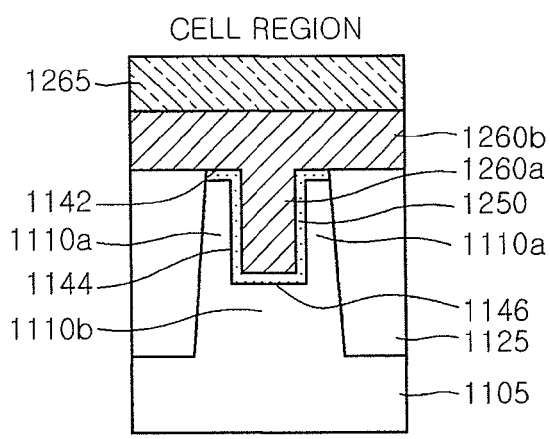

With reference to FIGS. 43A through 43C, the gate electrode material layer 1260 is next patterned to form laterally oriented portions 1260b of the gate electrodes in the cell regions, the laterally oriented gate electrodes 1260b' in the peripheral regions, and other conductive lines 1260c that form interconnects for the device. In one embodiment, patterning is performed by applying a SiN layer pattern 1265 on the gate electrode material layer 1260, and etching the gate electrode material layer 1260 using the SiN pattern as an etching mask.

Returning to FIGS. 39 and 40A through 40C, sidewall spacers 1171 are formed on the resulting structure by providing a dielectric layer on the resulting structure, and performing an anisotropic etch to form the spacers 1171. An ion implantation process is performed before or after formation of the spacers to form source and drain regions S, D using the gate electrodes 1260b, 1260b', and conductive lines 1260c as an etch mask. In particular, during ion implantation, the presence of the lateral portions 1260b of the gate electrodes prevents the thin body regions 1110a from becoming implanted or doped.

The method described above in connection FIGS. 41 through 43 results in a semiconductor device configuration as described in FIGS. 39 and 40 above. In particular, this embodiment of the present invention reduces the number of processing steps required for fabrication.

While this invention has been particularly shown and described with references to preferred embodiments thereof, it will be understood by those skilled in the art that various changes in form and details may be made herein without departing from the spirit and scope of the invention as defined by the appended claims.

We claim:

1. A method of forming a semiconductor device, comprising:
   providing a first transistor in a first region of a semiconductor layer, comprising:
      providing a cavity that extends in a vertical direction in the semiconductor layer;
      providing a first gate dielectric at a lower portion and inner sidewalls of the cavity;
      providing a gate electrode that fills a remaining portion of the cavity, the gate electrode extending in the vertical direction;
      providing a source region and a drain region in the semiconductor layer that are arranged at opposite sides of the gate electrode in a horizontal direction; and
      providing a lateral channel region of the semiconductor layer at a side of the gate electrode in a lateral direction that extends in the horizontal direction between the source region and the drain region wherein the lateral channel region of the first transistor comprises a first lateral channel region and a second lateral channel region at opposite sides of the gate electrode, each extending in the horizontal direction between the source region and the drain region; and
   providing a second transistor in a second region of the semiconductor layer, the second transistor comprising a planar transistor.

2. The method of claim 1 wherein providing the second transistor comprises:
   providing a second gate dielectric on the semiconductor layer;
   providing a gate electrode on the second gate dielectric; and
   providing a first channel region in the semiconductor layer that lies below a gate electrode and not at a lateral side portion of the gate electrode in a lateral direction that extends in the horizontal direction between the source region and the drain region.

3. The method of claim 1 wherein the first region is a memory cell region of the semiconductor device and wherein the second region is a peripheral region of the semiconductor device.

4. The method of claim 1 further comprising providing an isolation region between the first transistor and the second transistor.

5. The method of claim 1 further comprising providing in the first transistor a lower channel region that extends under the gate electrode between the source region and the drain region of the first transistor.

6. The method of claim 1 wherein the semiconductor layer comprises a semiconductor substrate.

7. The method of claim 1 wherein the semiconductor layer is one selected from the group consisting of SOI (silicon-on-insulator), SiGe (silicon germanium), and SGOI (silicon germanium on insulator) layers.

8. The method of claim 1 wherein providing the lateral channel region provides a lateral channel region that is of a height in the vertical direction ranging between about 500 and 2000 Angstroms.

9. The method of claim 1 wherein providing the lateral channel region provides a lateral channel region that is of a height in the vertical direction ranging between about 1000 and 1500 Angstroms.

10. The method of claim 1 wherein providing the lateral channel region provides a lateral channel region of a thickness in the lateral direction less than about 200 Angstroms.

11. The method of claim 1 wherein providing the lateral channel region provides a lateral channel region of a thickness in the lateral direction ranging between about 10 and 150 Angstroms.

12. The method of claim 1 wherein the lateral channel region is of a thickness that is selected as a function of a desired threshold voltage of the first transistor.

13. The method of claim 1 wherein the first gate dielectric is provided between the gate electrode of the first transistor and the source and drain regions and between the gate electrode of the first transistor and the lateral channel region.

14. The method of claim 13 further comprising providing a second dielectric between a gate electrode and a channel region of the second transistor and wherein the second dielectric is of a different thickness than the first dielectric.

15. The method of claim 13 further comprising providing a second dielectric between a gate electrode and a channel region of the second transistor and wherein the second dielectric is of a different material than the first dielectric.

16. The method of claim 1 wherein providing the gate electrode comprises providing a first portion that extends into the semiconductor layer in the vertical direction and a second portion that extends on the semiconductor layer in the horizontal or lateral directions.

17. The method of claim 16 wherein the first portion is formed of a material that is different than the second portion.

18. The method of claim 17 wherein the material of the first portion has a direct effect on a threshold voltage of the first transistor.

19. The method of claim 16 wherein the material of the first portion and the material of the second portion comprise metal and polysilicon respectively.

20. The method of claim 1 wherein a threshold voltage of the first transistor and a threshold voltage of the second transistor are different.

21. The method of claim 1 wherein the gate electrode has a T-shaped cross-section.

22. The method of claim 1 further comprising providing two of the first transistors located adjacent each other in the horizontal direction in the first region, and wherein the two first transistors share a common drain region.

23. The method of claim 1 wherein an outer surface of the lateral channel region opposite the side of the gate electrode is adjacent an insulative region.

24. The method of claim 23 wherein the insulative region comprises a trench isolation region.

25. A method of forming a semiconductor device comprising
defining a first active region and a second active region of a common semiconductor layer by using a first mask layer pattern and a second mask layer pattern, respectively;
etching the first mask layer pattern in the first active region to reduce a width of the first mask layer pattern in a lateral direction by a first distance;
providing a third mask layer on the first active region to at least a level of the first mask layer pattern;
removing the first mask layer pattern in the first active region;
forming a vertical opening in a vertical direction of the semiconductor layer in the first active region using the third mask layer as an etch mask, sidewalls of the vertical opening having adjacent source and drain regions of the first active region in a horizontal direction and having at least one adjacent vertically oriented thin body channel region of the first active region along a sidewall of the vertical opening in the lateral direction;
providing a first gate dielectric on a bottom and the sidewalls of the vertical opening in the first active region;
providing a first gate electrode in a remaining portion of the opening on the gate dielectric in the first active region, to form a first transistor having the vertically oriented thin body channel region in the first active region;
removing the second mask layer to expose a surface of the semiconductor layer in the second active region;
providing a second gate dielectric on the semiconductor layer in the second active region; and
providing a second gate electrode on the second gate dielectric in the second active region, to form a second transistor in the second active region, the second transistor comprising a planar transistor.

26. The method of claim 25 wherein the thickness of the vertically oriented thin body channel region is determined according to the first distance of the reduced width of the first mask layer pattern.

27. The method of claim 25 further comprising forming trenches in the semiconductor layer to define the first active region and the second active region.

28. The method of claim 27 wherein the vertically oriented thin body channel region is formed in the first active region of the semiconductor layer between one of the trenches and the vertical opening.

29. The method of claim 25 further comprising doping the vertically oriented thin body channel region to form a lateral channel region.

30. The method of claim 25 further comprising doping the first active region under the vertical opening to form a lower channel region.

31. The method of claim 25 further comprising doping the source and drain regions of the first active region.

32. The method of claim 25 further comprising forming a buffer layer on the first active region and the second active region between the semiconductor layer and the first mask pattern, and wherein the buffer layer protects an upper surface of the first active region during etching the first mask layer pattern.

33. The method of claim 25 wherein etching the first mask layer pattern further comprises etching the first mask layer pattern in the second active region.

34. The method of claim 25 wherein providing vertical openings comprises providing multiple vertical openings using the second mask layer as an etch mask.

35. The method of claim 25 wherein providing the first gate electrode comprises providing a first portion that extends into the semiconductor layer in the vertical direction and providing a second portion that extends on the semiconductor layer in the horizontal or lateral directions and wherein the first portion is formed of a material that is different than the second portion.

36. The method of claim 35 wherein the first portion is formed of a material that is different than the second portion.

37. The method of claim 35 wherein the material of the first portion has a direct effect on a threshold voltage of the first transistor.

38. The method of claim 35 wherein the material of the first portion and the material of the second portion comprise metal and polysilicon respectively.

39. The method of claim 25 wherein the first gate electrode has a T-shaped cross-section.

40. The method of claim 25 wherein the first active region is a memory cell region of the semiconductor device and wherein the second active region is a peripheral region of the semiconductor device.

41. The method of claim 25 wherein the semiconductor layer comprises a semiconductor substrate.

42. The method of claim 25 wherein the semiconductor layer is one selected from the group consisting of SOI (silicon-on-insulator), SiGe (silicon germanium), and SGOI (silicon germanium on insulator) layers.

43. The method of claim 25 wherein the vertically oriented thin body channel region is of a thickness that is selected as a function of a desired threshold voltage of the first transistor.

44. The method of claim 25 wherein the vertically oriented thin body channel region of the first transistor comprises a first lateral channel region and a second lateral channel region at opposite sides of the gate electrode in the lateral direction, each extending in a horizontal direction between the source region and the drain region.

45. The method of claim 25 wherein the second gate dielectric is of a different thickness than the first gate dielectric.

46. The method of claim 25 wherein the second gate dielectric is of a different material than the first gate dielectric.

47. The method of claim 25 wherein a threshold voltage of the first transistor and a threshold voltage of the second transistor are different.

48. The method of claim 25 further comprising providing two of the first transistors located adjacent each other in the horizontal direction in the first region, and wherein the two first transistors share a common drain region.

* * * * *